(12) United States Patent
Shepard

(10) Patent No.: US 9,437,657 B2
(45) Date of Patent: *Sep. 6, 2016

(54) SOLID STATE DEVICES HAVING FINE PITCH STRUCTURES

(71) Applicant: HGST, Inc., San Jose, CA (US)

(72) Inventor: Daniel R. Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/616,128

(22) Filed: Feb. 6, 2015

(65) Prior Publication Data

US 2015/0155336 A1  Jun. 4, 2015

Related U.S. Application Data

(63) Continuation of application No. 14/078,769, filed on Nov. 13, 2013, now Pat. No. 8,980,532.

(60) Provisional application No. 61/725,620, filed on Nov. 13, 2012.

(51) Int. Cl.
| | |
|---|---|
| *G03F 7/26* | (2006.01) |
| *H01L 27/24* | (2006.01) |
| *H01L 21/311* | (2006.01) |
| *H01L 45/00* | (2006.01) |
| *H01L 21/033* | (2006.01) |
| *H01L 27/102* | (2006.01) |

(52) U.S. Cl.
CPC ....... *H01L 27/2463* (2013.01); *H01L 21/0337* (2013.01); *H01L 21/311* (2013.01); *H01L 21/31144* (2013.01); *H01L 27/2409* (2013.01); *H01L 45/06* (2013.01); *H01L 45/1233* (2013.01); *H01L 45/144* (2013.01); *H01L 45/1683* (2013.01); *H01L 27/1021* (2013.01)

(58) Field of Classification Search
CPC ..................... H01L 45/1675; H01L 45/1691
USPC .................................................. 430/314, 317
See application file for complete search history.

(56) References Cited

U.S. PATENT DOCUMENTS

| | | | |
|---|---|---|---|
| 8,980,532 B2 * | 3/2015 | Shepard | H01L 21/0337 430/317 |
| 2007/0048674 A1 * | 3/2007 | Wells | H01L 27/101 430/313 |

* cited by examiner

*Primary Examiner* — Thomas L Dickey
(74) *Attorney, Agent, or Firm* — Patterson & Sheridan, LLP

(57) ABSTRACT

In various embodiments, a method for forming a memory array includes forming a plurality of rows and columns of hardmask material, etching holes in the one or more layers of insulating material using the combined masking properties of the rows of hardmask material and the columns of hardmask material, and forming memory cells in the holes. The corners of the holes can be rounded.

20 Claims, 42 Drawing Sheets

SOLID STATE DEVICES HAVING FINE PITCH STRUCTURES

CROSS-REFERENCE TO RELATED APPLICATIONS

This application is a continuation of, and claims priority to and the benefits of, U.S. patent application Ser. No. 14/078,769, filed Nov. 13, 2013, which claims priority to and the benefit of U.S. Provisional Patent Application Ser. No. 61/725,620, filed on Nov. 13, 2012, which is hereby incorporated herein by reference in its entirety.

TECHNICAL FIELD

Embodiments of the present invention relate to the manufacture and processing of semiconductor wafers, and more particularly to methods for forming devices having very fine pitch features.

BACKGROUND

Today's electronic devices contain sophisticated circuits, many of which have been made possible by fabricating highly dense arrays of conductors and components. These conductors and components are typically fabricated by using photolithographic techniques. As the demand for more complex circuits (and higher capacity in memory devices made from these complex circuits) increases, however, the need to form even finer features rises. In the case of memory devices, higher-capacity storage requires finer conductors and spacing.

The limits to photolithographic techniques are related to the desired feature size and the wavelength of the light used to project an image on the semiconductor substrate. This projection is performed using reticules that can be very costly to produce. For this reason, it is desirable to limit the number of reticules required. As the extreme limits of the photolithographic process are approached, however, the spreading of the edges of the projected images can cause artifacts where these edges overlap and form undesired projected images due to the additive nature of the process. One way to avoid this effect is to maintain a greater spacing between desired features so as to avoid the edge overlapping. This greater spacing prevents the tight packing of lines desired for high density memory arrays, however.

A technique to retain the tight packing of lines while avoiding this additive edge effect is double-patterning, a technique in which one mask is used to project the image of only a subset of desired features (e.g., even-numbered array lines), thereby leaving wider spacing between those even lines so as to avoid the additive edge effect. A second mask is then used to project the remaining features (e.g., odd-numbered array lines, centered in the spaces between the even-numbered lines) and thus create the desired high density packing. The downside to this technique is the increase in the number of required masks.

In the case of diode-array memories in particular, the need for smaller diode formation to fit within the pattern of finer conductors and spacing introduces additional problems. For example, the vertically formed diode at each memory cell location is sometimes created by overlapping a row and column line thereby forming a square (or nearly square) feature which is the footprint of the vertical diode. However, in those methods in which the square feature is a hole in which a diode is grown, the corners can cause the formation of stacking faults while silicon is epitaxially grown in the holes. Also, these corners can be a source of current leakage in the formed diodes during operation. In addition, the information-storage element formed using the diode of a diode-array memory must have a consistent dimension across all instances of the element across die in order to prevent variations in the operating parameters that would render both the programming voltages and currents as well as the read threshold between a one bit and a zero bit difficult to calibrate. A need therefore exists for a way to create high-density arrays of elements using a minimum number of masks.

SUMMARY

Embodiments of the present invention include creation of tightly packed features required for (e.g.) high-density diode array memories (or any other similar structures) without the need for high-density photolithographic masks or double-patterning, and also the creation of diodes without corners from the overlap of a tightly packed row feature with a tightly packed column feature. In one embodiment, a plurality of rows of hardmask material are created using a photolithographic step; the rows are spaced out to correspond to only every other bit or wordline in an array. The remaining rows (placed in-between the photolithographic rows) are formed via deposition of the hardmask material after, in one embodiment, deposition of another material to create sidewall "cushion" spaces adjacent to the photolithographic rows. In another embodiment, a plurality of rows of insulating material are created in a photolithographic step, again corresponding to only every other bit or wordline in an array. A layer of hardmask material is then deposited on the rows of insulating material such that sidewalls of hardmask material are grown laterally from the rows of insulating material.

In one aspect, a method for forming an array includes forming a plurality of rows of hardmask material above one or more layers of insulating material, forming a plurality of columns of hardmask material above the plurality of rows of hardmask material, etching holes in the one or more layers of insulating material using the combined masking properties of the rows of hardmask material and the columns of hardmask material, and forming memory cells in the holes.

A first subset of the plurality of rows may be formed by a lithographic step and wherein a second subset of the plurality of rows are thereafter formed by a deposition step. The first subset of the plurality of rows may be separated by a distance corresponding to double a distance between array bitlines, and wherein the second subset of the plurality of rows are deposited between the first subset of the plurality of rows. The deposition step may include forming sidewall hardmask features on the sides the first subset of the plurality of rows and depositing the second subset of the plurality of rows, wherein a thickness of sidewall material in the sidewall hardmask features is defined by the deposition step. Forming the plurality of rows of hardmask material may include forming a plurality of rows of insulating material and depositing a layer of hardmask material on top of the plurality of rows of insulating material. A first subset of the plurality of columns may be formed by a lithographic step and wherein a second subset of the plurality of columns are thereafter formed by a deposition step. The deposition step may include forming sidewall hardmask features on the sides the first subset of the plurality of columns and depositing the second subset of the plurality of columns; wherein a thickness of sidewall material in the sidewall hardmask features may be defined by the deposition step. Etching the holes may include performing a selective etch of the insulating material, wherein the insulating material may include at least two different types of insulating materials, and wherein selectively etched hole may include a first diameter etched in a first type of insulating material and a second diameter larger than the first diameter etched in a second type of insulating material. An electronic circuit in electrical communication with the array may be formed.

In another aspect, An electronic circuit in the form of an array includes features that have been formed by forming a plurality of rows of hardmask material above one or more layers of insulating material, forming a plurality of columns of hardmask material above the plurality of rows of hardmask material, etching holes in the one or more layers of insulating material using the combined masking properties of the rows of hardmask material and the columns of hardmask material, and forming memory cells in the holes.

A first subset of the plurality of rows may be formed by a lithographic step and wherein a second subset of the plurality of rows are thereafter formed by a deposition step. The deposition step may include forming sidewall hardmask features on the sides the first subset of the plurality of rows and depositing the second subset of the plurality of rows, wherein a thickness of sidewall material in the sidewall hardmask features is defined by the deposition step. A first subset of the plurality of columns may be formed by a lithographic step and wherein a second subset of the plurality of columns are thereafter formed by a deposition step. The deposition step may include forming sidewall hardmask features on the sides the first subset of the plurality of columns and depositing the second subset of the plurality of columns, wherein a thickness of sidewall material in the sidewall hardmask features is defined by the deposition step.

In another aspect, an electronic system includes one or more array circuits; the array circuits include features that have been formed by forming a plurality of rows of hardmask material above one or more layers of insulating material, forming a plurality of columns of hardmask material above the plurality of rows of hardmask material, etching holes in the one or more layers of insulating material using the combined masking properties of the rows of hardmask material and the columns of hardmask material, and forming memory cells in the holes.

A first subset of the plurality of rows may be formed by a lithographic step and wherein a second subset of the plurality of rows are thereafter formed by a deposition step. The deposition step may include forming sidewall hardmask features on the sides the first subset of the plurality of rows and depositing the second subset of the plurality of rows, wherein a thickness of sidewall material in the sidewall hardmask features is defined by the deposition step. A first subset of the plurality of columns may be formed by a lithographic step and wherein a second subset of the plurality of columns are thereafter formed by a deposition step. The deposition step may include forming sidewall hardmask features on the sides the first subset of the plurality of columns and depositing the second subset of the plurality of columns, wherein a thickness of sidewall material in the sidewall hardmask features is defined by the deposition step. The holes in which memory cells are formed may have corners and these corners may be rounded.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Figure 1:
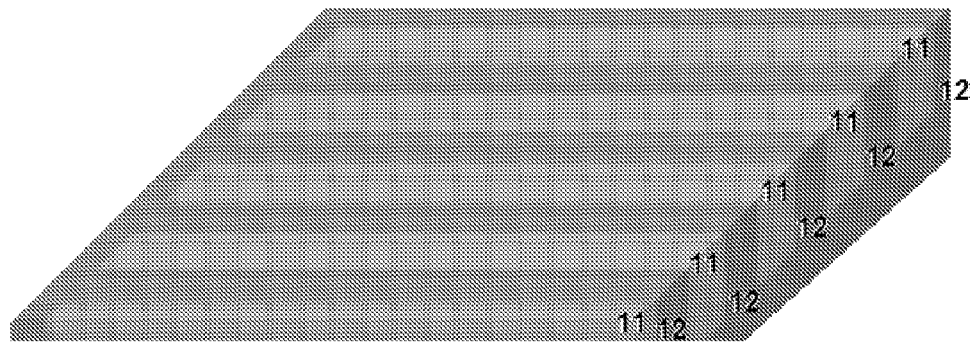
FIG. 1 illustrates wafer including doped bit lines in a substrate in accordance with an embodiment of the present invention.

Embodiments of the present invention include a means and method to form very fine features in a semiconductor process as would be required for high-density electronic memory devices and to do so consistently. Consistency is especially important for resistive memory cells because variation in the processing of the individual memory cells can lead to variation across the wafer and even across a single die that can result in difficulty in calibrating the sense amp level of the output stage of the die. This is because a slight difference in the size of the resistive change memory element can result in a significant resistance difference when reading. If this difference is too great from one area on a given die to another, it can be difficult to set a threshold level which determines the cross over point between a one bit and a zero bit. Likewise, if the difference is too great from one area on a given die to another, it can be difficult to set a programming voltage and/or current level that will reliably set or reset the information storage element at a given bit location.

Photolithographic techniques will print features, but these features will have variation at their edges. This is typical of photolithography. This not much of a problem when the features are large relative to the range at the edges where this variation occurs, but as the features become very small, the variation of the edges becomes a much larger portion of the overall feature. Even when features are printed using double-exposure techniques, this variation from each exposure of the double exposure pair will combine to create even greater variance. To pattern a hole for forming a memory cell consisting of a vertical diode and phase-change memory element, photolithographic techniques are used to double-pattern a square feature by first patterning a stripe in one direction and then patterning a stripe in an orthogonal direction; where the two stripes overlap, a square is patterned. (Because of the variation at the edges and the additive nature of the two exposures, the corners are least exposed whereas the center is most exposed and, as a result, a more circular feature will be created. This circular pattern is desirable when fabricating a memory cell consisting of a vertical diode and phase-change memory element, particularly because sharper corners in the hole for which the diode is to be formed can result in more stacking faults when depositing the semiconducting material to form the diode—e.g., as will be the case when forming a silicon diode with an epitaxial deposition technique. However, when the memory cell elements are formed by patterning and forming a line in one direction to overlap a line patterned and formed in an orthogonal direction, the corners will be much sharper.) The present invention includes a means and method to pattern less critical aspects of a pattern of features (such as the spaces between critically patterned lines) in a way that minimizes variation of the more critical features such as conductive lines and memory cell elements.

Figure 2:
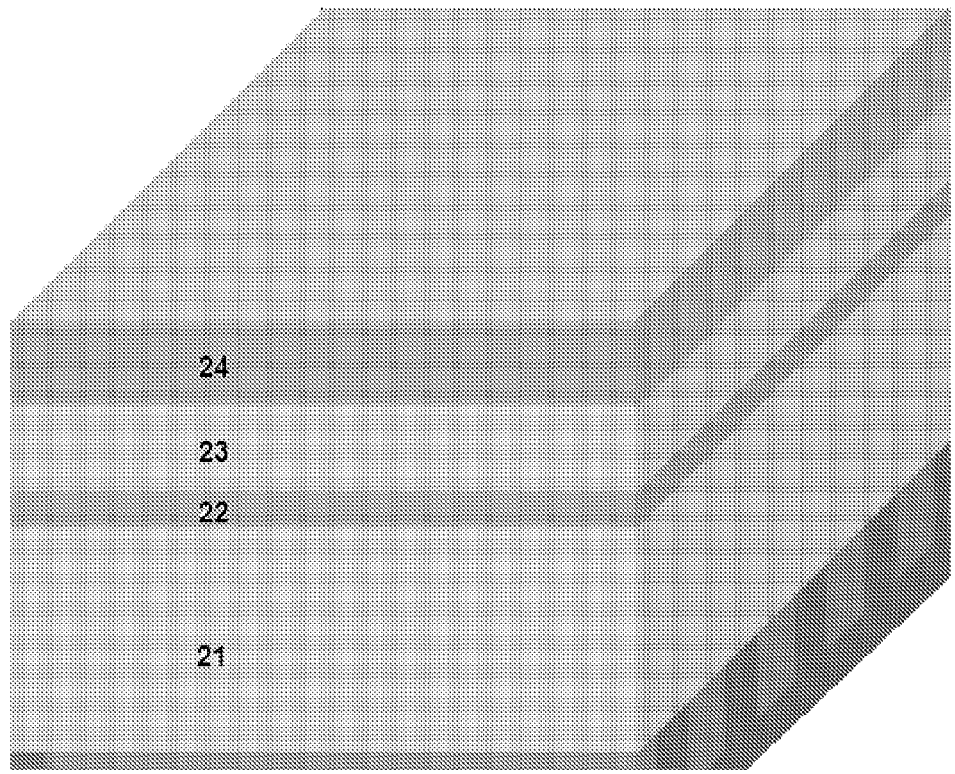
FIG. 2 illustrates the wafer after the deposition of layers of materials in accordance with an embodiment of the present invention.
Figure 3:
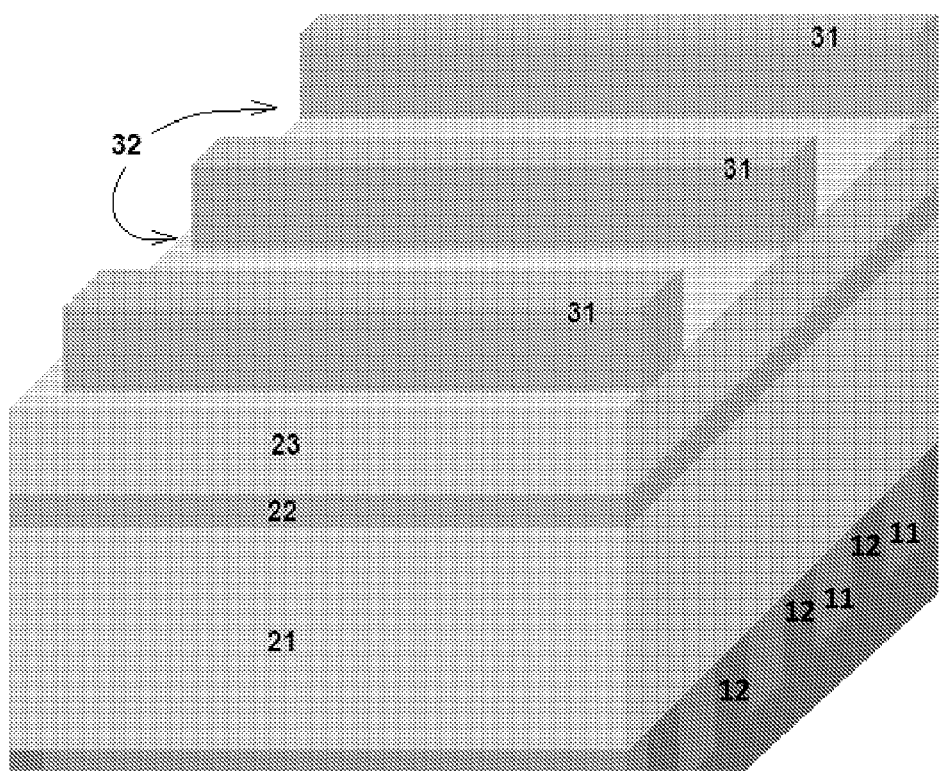
FIG. 3 illustrates the wafer after patterning and etching a top layer in accordance with an embodiment of the present invention.

In one embodiment of the present invention, precision deposition techniques are used to form an etch mask by sidewall deposition. Referring to FIG. 1, a portion of a partly processed silicon wafer 10 is depicted showing part of a series of bitlines 11 that have been formed and that are separated by spaces 12 made of reverse doped silicon, shallow trench dielectric isolation (STI), or the like as is well understood by those skilled in the art. FIG. 2 shows this portion of the wafer after depositing a series of electrically insulating layers such as silicon oxide 21, silicon nitride 22, and silicon oxide 23; any number, type, or order of insulating layers are is within the scope of the present invention, however, and the present invention is not limited to only the depicted layers. A layer of polysilicon 24 is deposited on the insulating layers 21, 22, 23; this polysilicon layer 24 is later used as a hardmask, as explained in greater detail below. As depicted in FIG. 3, the polysilicon 24 is patterned and etched into rows 31; these rows 31 are generally positioned above every other space 12 between the bitlines 11. By forming these polysilicon rows 31 above every other space 12 (each row 31 having generally the same width as the underlying space 12), the spaces 32 between the polysilicon rows 31 may be roughly three times as wide as the polysilicon rows 31 themselves and, as a result, the photolithographic difficulty to pattern these polysilicon rows 31 is reduced and double patterning to form these rows may be avoided.

Figure 4:
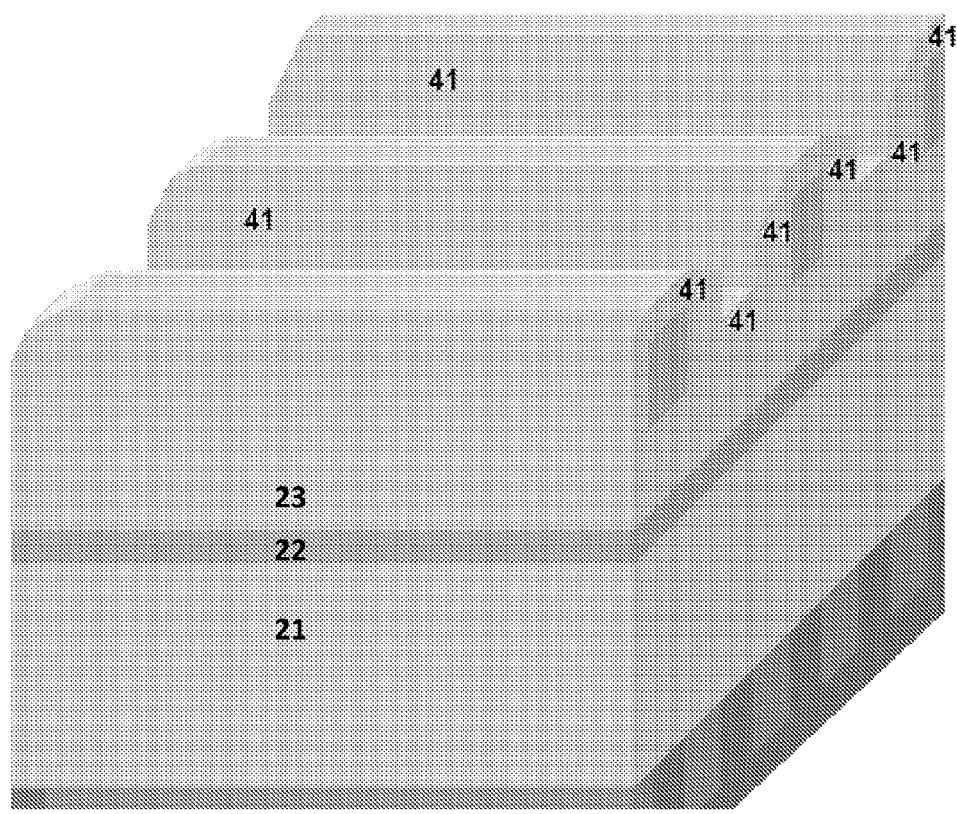
FIG. 4 illustrates the wafer after applying a conformal coating in accordance with an embodiment of the present invention.
Figure 5:
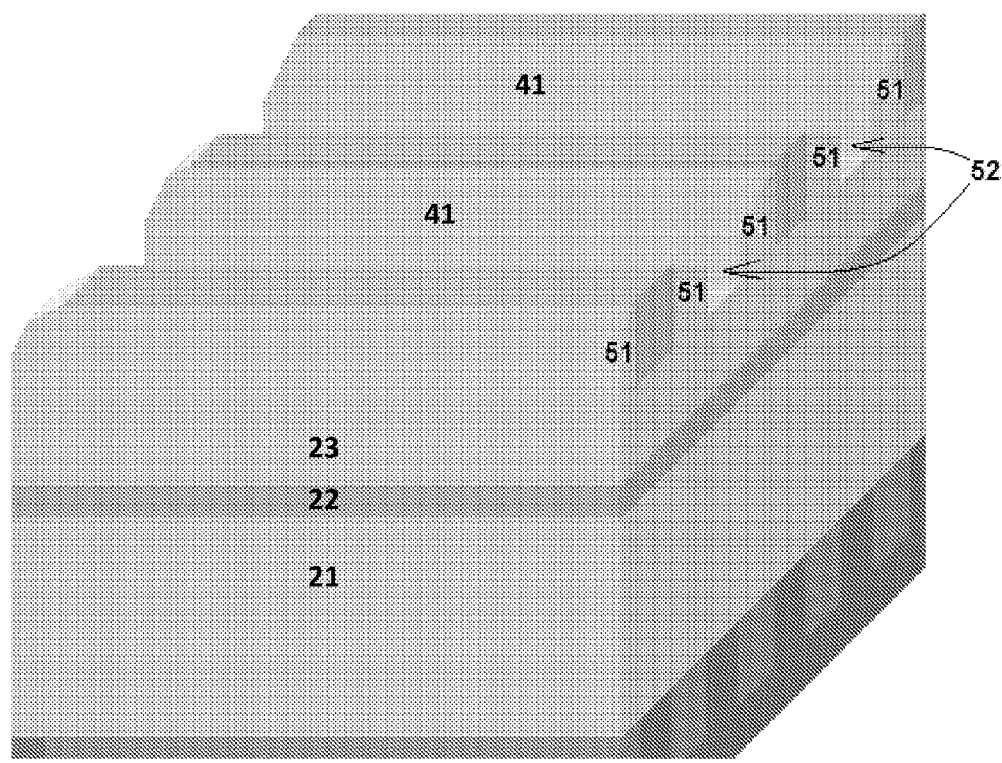
FIG. 5 illustrates the wafer after anisotropic etch-back of the conformal coating in accordance with an embodiment of the present invention.

In FIG. 4, a deposited layer of conformal silicon oxide 41 is deposited on top of the polysilicon 31 and silicon oxide 23. The conformal silicon oxide layer 41 may be deposited with a precision deposition process such as atomic layer deposition (ALD) having a thickness equal to the desired feature size (in this case, a measure across the holes to be formed to fabricate the memory cells). This deposited layer of conformal silicon oxide 41 may be etched back (as depicted in FIG. 5) using (for example) a side-wall spacer etch-back technique as is well understood by those skilled in the art. A layer of polysilicon is next deposited across the wafer to fill in the spaces 52 between deposited sidewalls 51.

Figure 6:
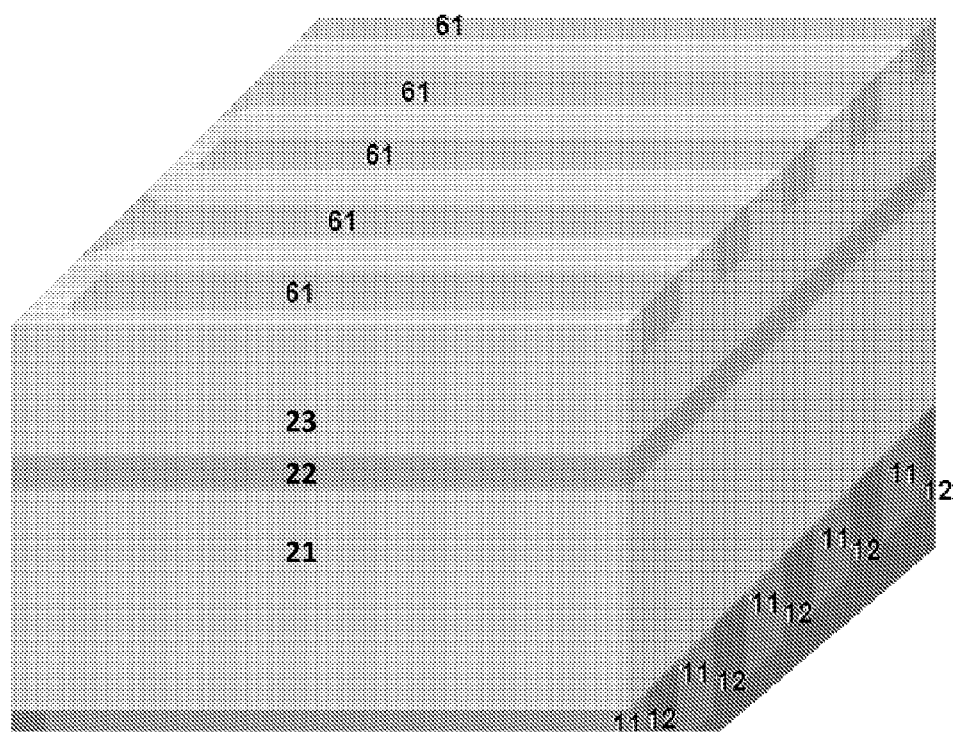
FIG. 6 illustrates the wafer after material deposition and planarization in accordance with an embodiment of the present invention.

As shown in FIG. 6, the wafer is planarized (e.g., as by chemical-mechanical polishing or CMP) to form rows 61 of hardmask material above the spaces 12 between the bitlines 11. Note that there is now a polysilicon row 61 above every space 12 between the bitlines 11; every other of these polysilicon rows 61 was formed by patterning the initial layer of polysilicon 24 and the remaining rows were formed by depositing polysilicon across the wafer to fill in the spaces 52 between deposited sidewalls 51.

Figure 7:
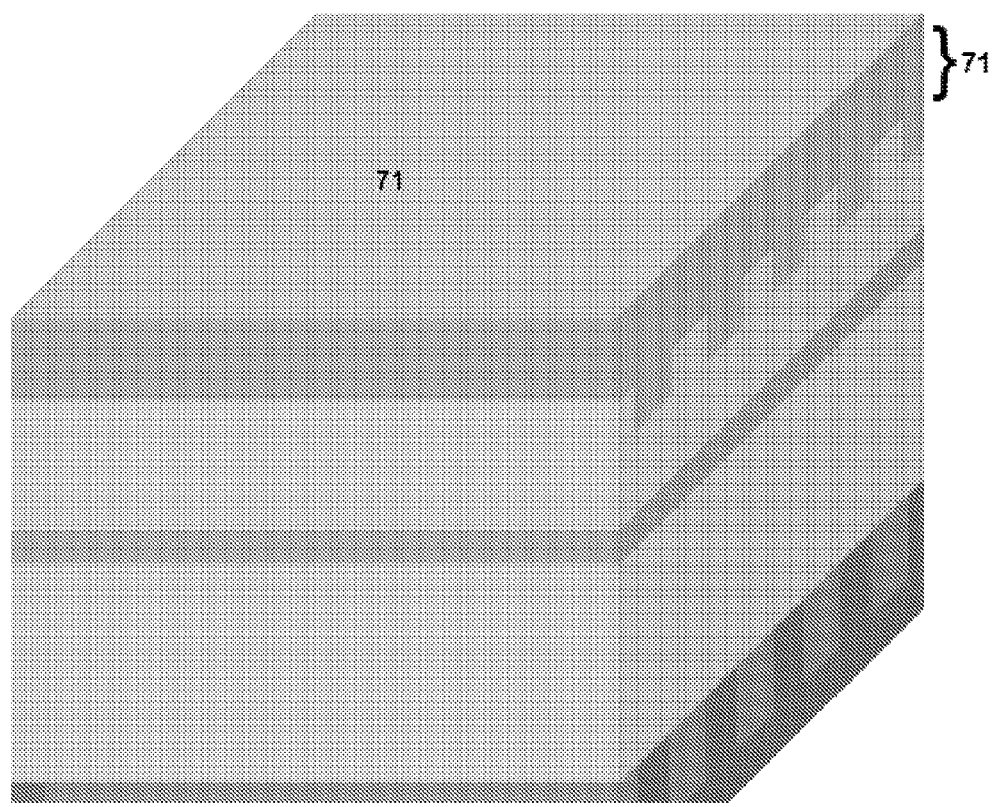
FIG. 7 illustrates the wafer after material deposition in accordance with an embodiment of the present invention.

In FIG. 7, a layer of polysilicon 71 is deposited in preparation of generally repeating the steps depicted in FIGS. 3 through 6 for an orthogonal hardmask pattern.

Figure 8:
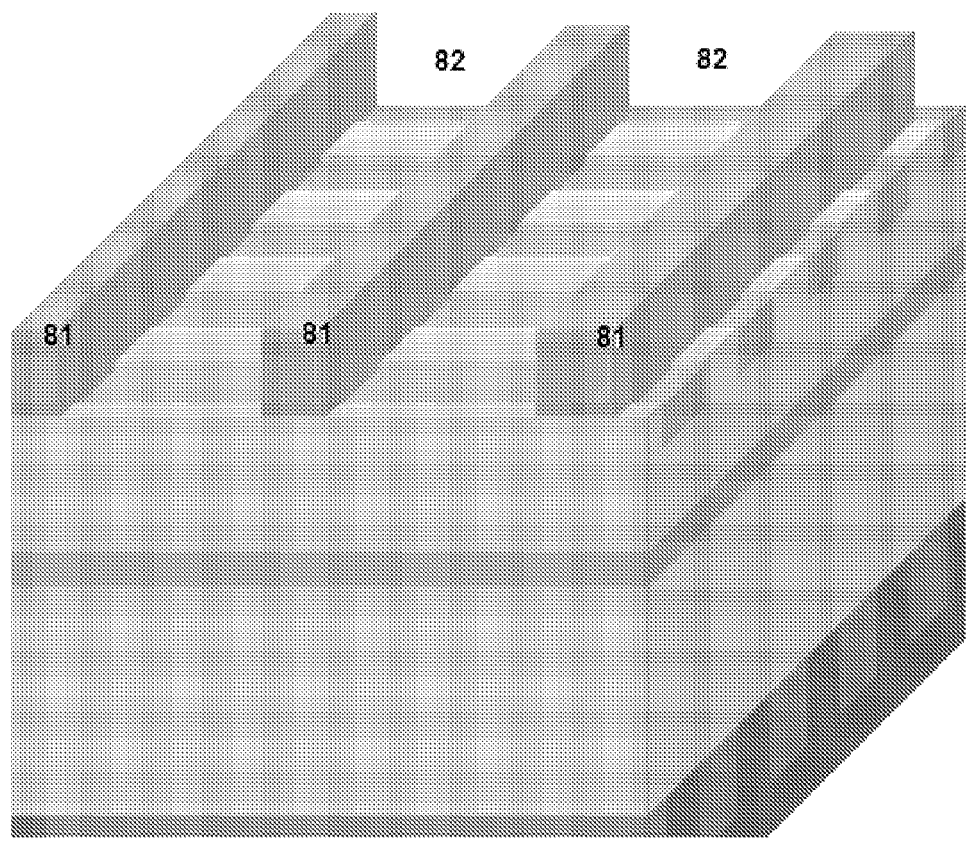
FIG. 8 illustrates the wafer after patterning and etching the top layer in accordance with an embodiment of the present invention.

As depicted in FIG. 8, this polysilicon 71 is patterned and etched into columns 81; these columns are generally positioned where every other space between the memory cells is to be formed. Each column 81 may have generally the same width as the desired memory cell space. The spaces 82 between the polysilicon columns 81 may be roughly three times as wide as the polysilicon columns 81 themselves and, as a result, the photolithographic difficulty to pattern these polysilicon columns 81 is reduced and double patterning to form these columns may be avoided.

Figure 9:
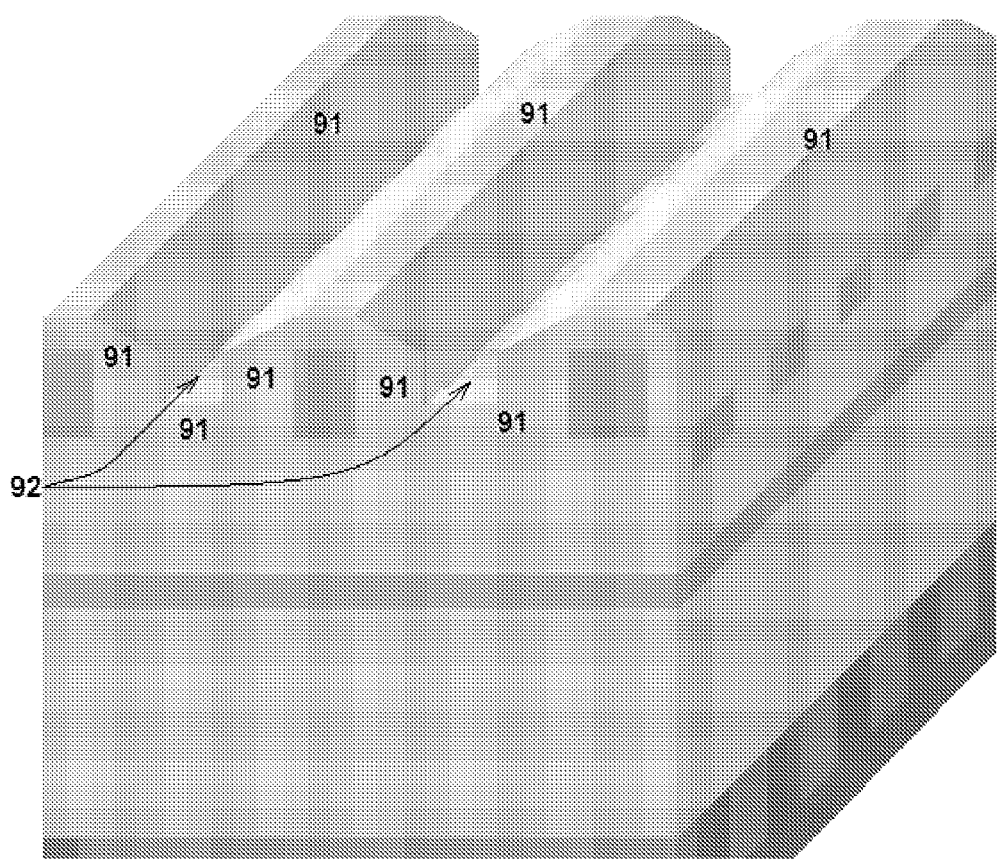
FIG. 9 illustrates the wafer after applying a conformal coating in accordance with an embodiment of the present invention.
Figure 10:
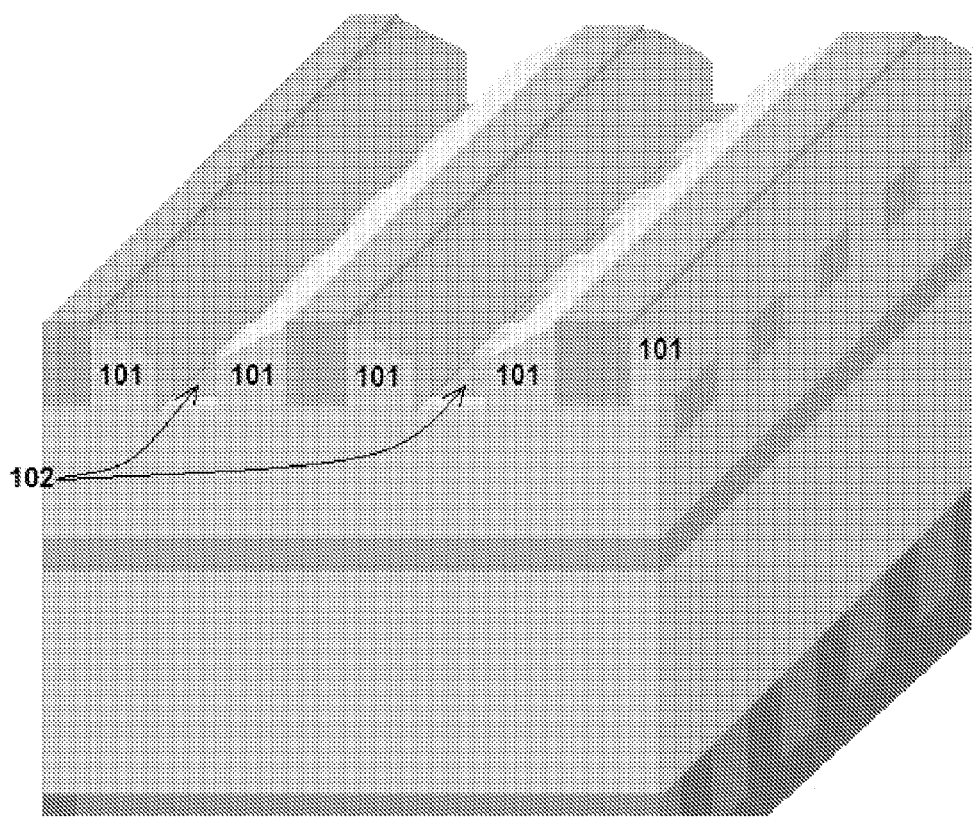
FIG. 10 illustrates the wafer after anisotropic etch-back of the conformal coating in accordance with an embodiment of the present invention.

In FIG. 9, a deposited layer of conformal silicon oxide 91 is deposited. This layer may be deposited with a precision deposition process such as atomic-layer deposition (ALD) having a thickness equal to the desired feature size (in this case, the orthogonal measure across the holes to be formed to fabricate the memory cells as was depicted in FIG. 4). This deposited layer of conformal silicon oxide 91 is etched back (as depicted in FIG. 10) using a side-wall spacer etch-back technique as is well understood by those skilled in the art. A layer of polysilicon may be next deposited across the wafer to fill in the spaces 102 between deposited sidewalls 101.

Figure 11:
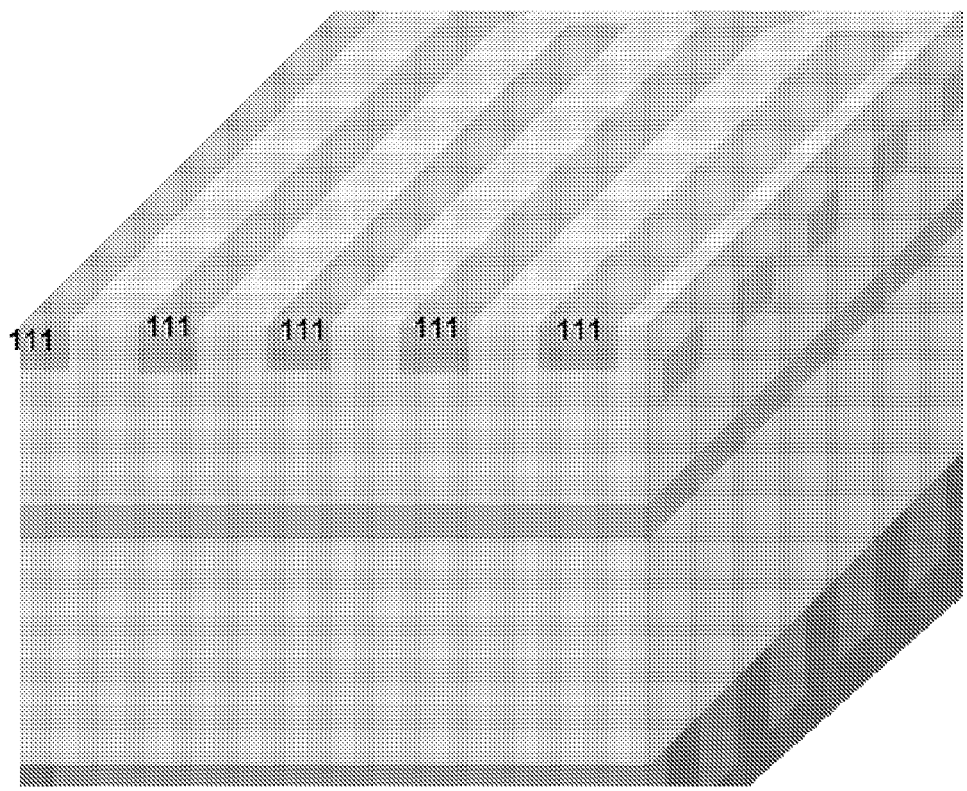
FIG. 11 illustrates the wafer after material deposition and planarization in accordance with an embodiment of the present invention.

As shown in FIG. 11, the wafer is planarized (e.g., as by chemical-mechanical polishing or CMP) to form columns 111 of hardmask material to protect the spaces between the memory cells. Note that there is now a polysilicon column 111 between every intended memory cell; every other of these polysilicon columns 111 was formed by patterning the deposited layer of polysilicon 71 and the remaining rows were formed by depositing polysilicon across the wafer to fill in the spaces 102 between deposited sidewalls 101.

Figure 12:
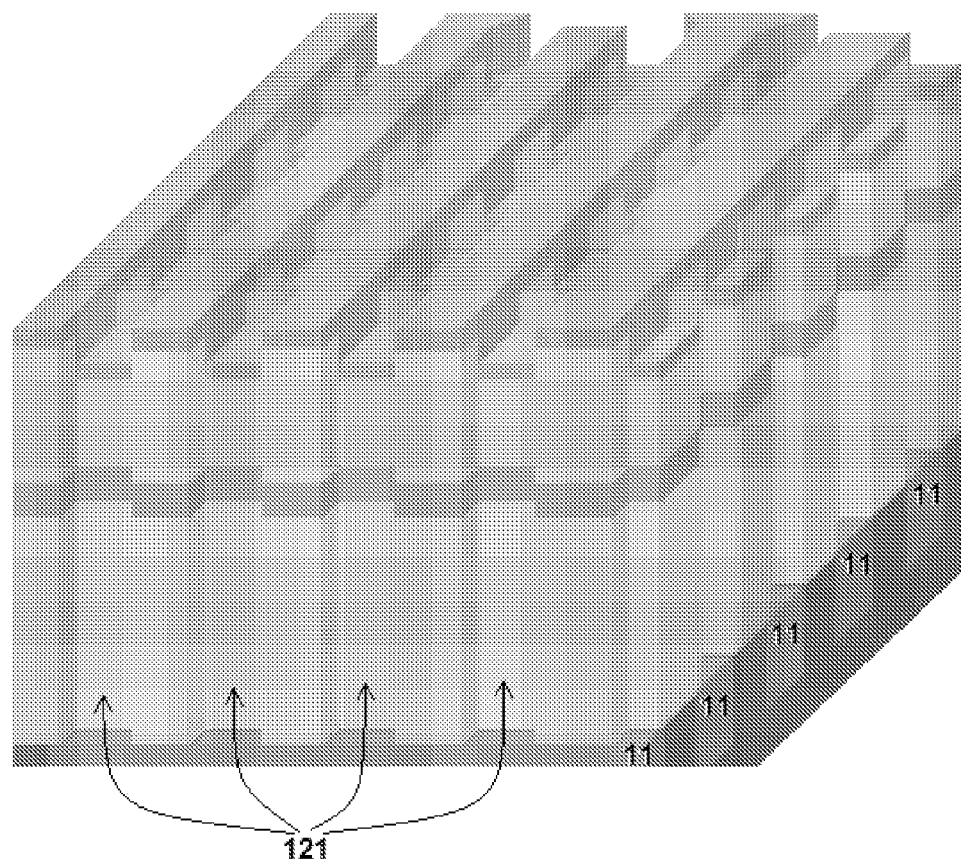
FIG. 12 illustrates the wafer after anisotropicly etching holes for diode formation in accordance with an embodiment of the present invention.
Figure 13:
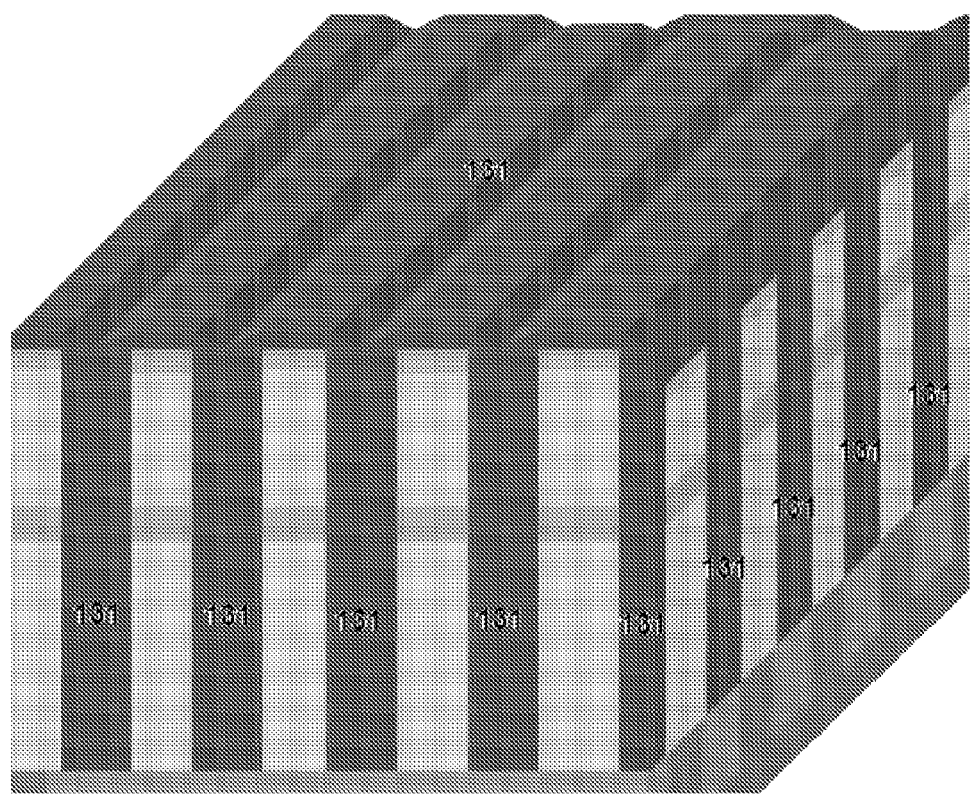
FIG. 13 illustrates the wafer after applying a bottom anti-reflective coating ("BARC") in accordance with an embodiment of the present invention.
Figure 14:
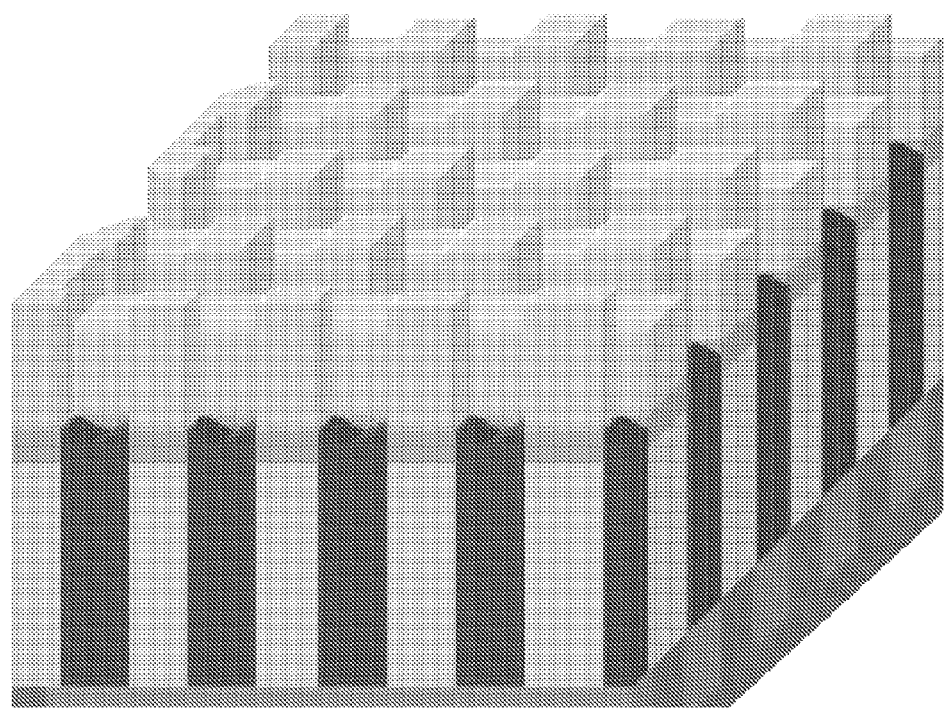
FIG. 14 illustrates the wafer after etch-back of the BARC layer and removal of the hardmask material in accordance with an embodiment of the present invention.
Figure 15:
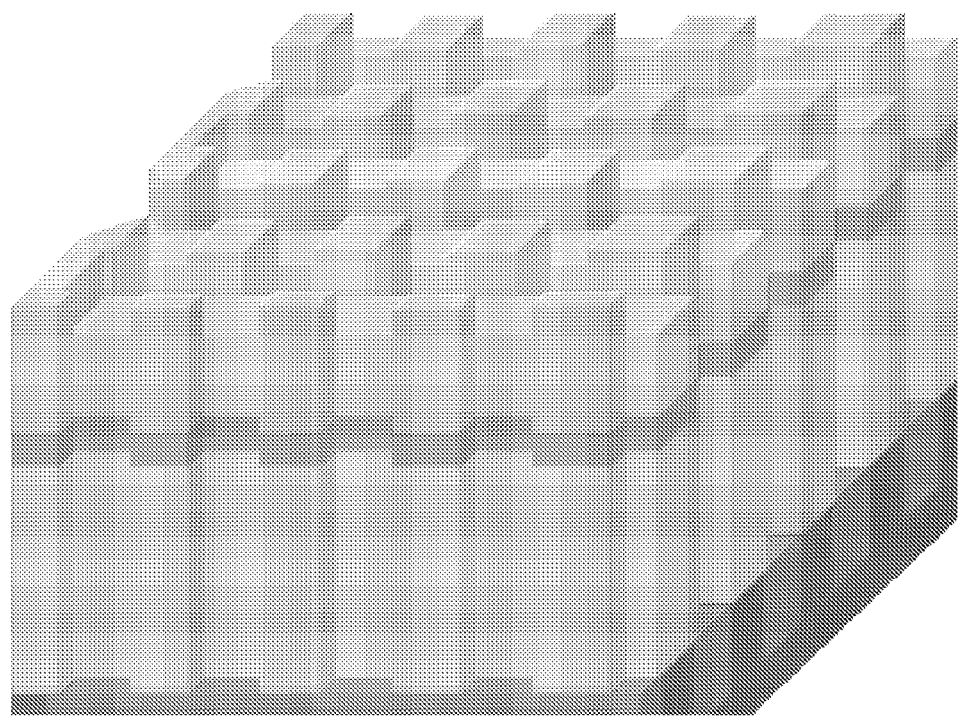
FIG. 15 illustrates the wafer after de-scum removal of the remaining BARC material in accordance with an embodiment of the present invention.
Figure 16:
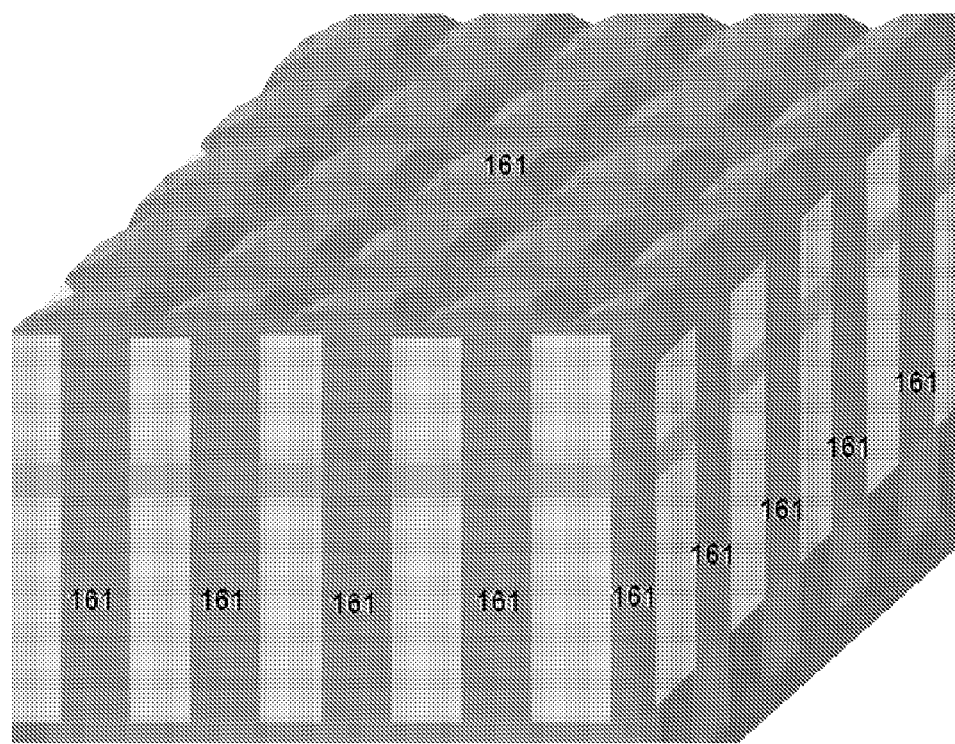
FIG. 16 illustrates the wafer after selective epitaxial silicon growth in accordance with an embodiment of the present invention.
Figure 17:
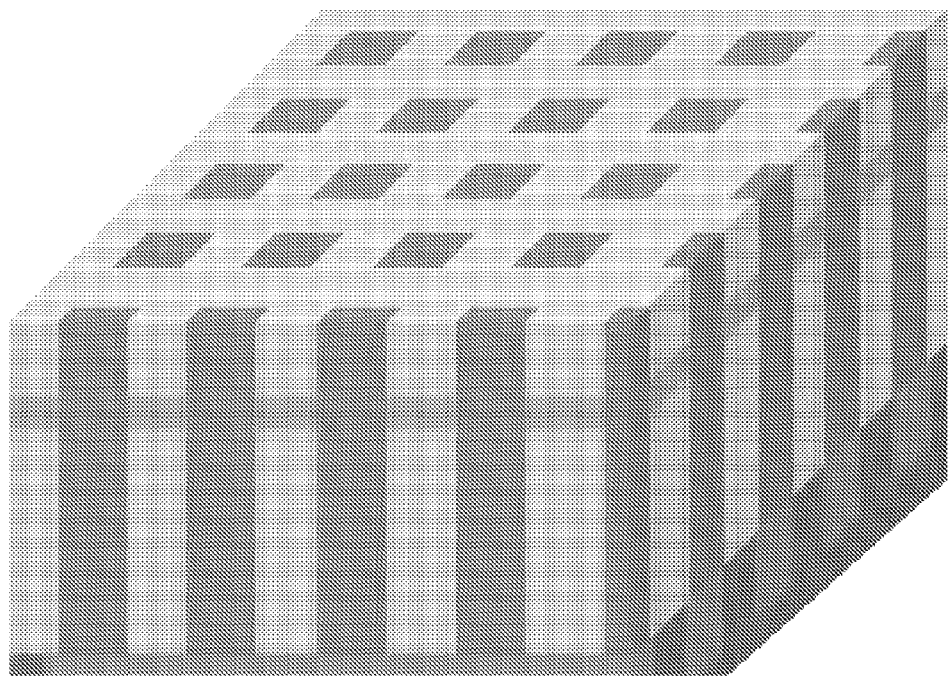
FIG. 17 illustrates the wafer after planarization of the epi-silicon in accordance with an embodiment of the present invention.
Figure 18:
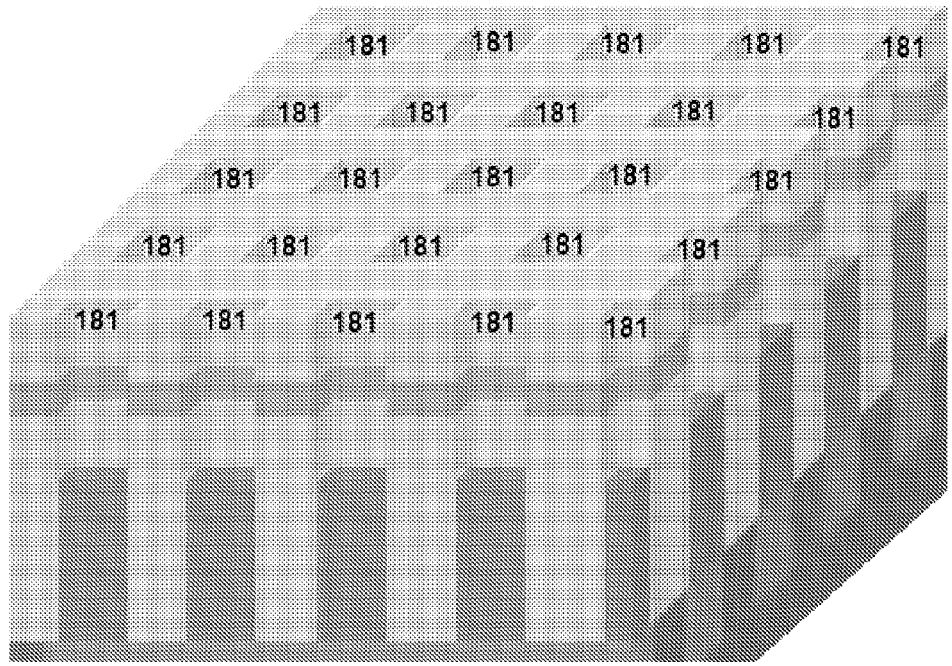
FIG. 18 illustrates the wafer after anisotropic etch-back of the epi-silicon to form cups in accordance with an embodiment of the present invention.
Figure 19:
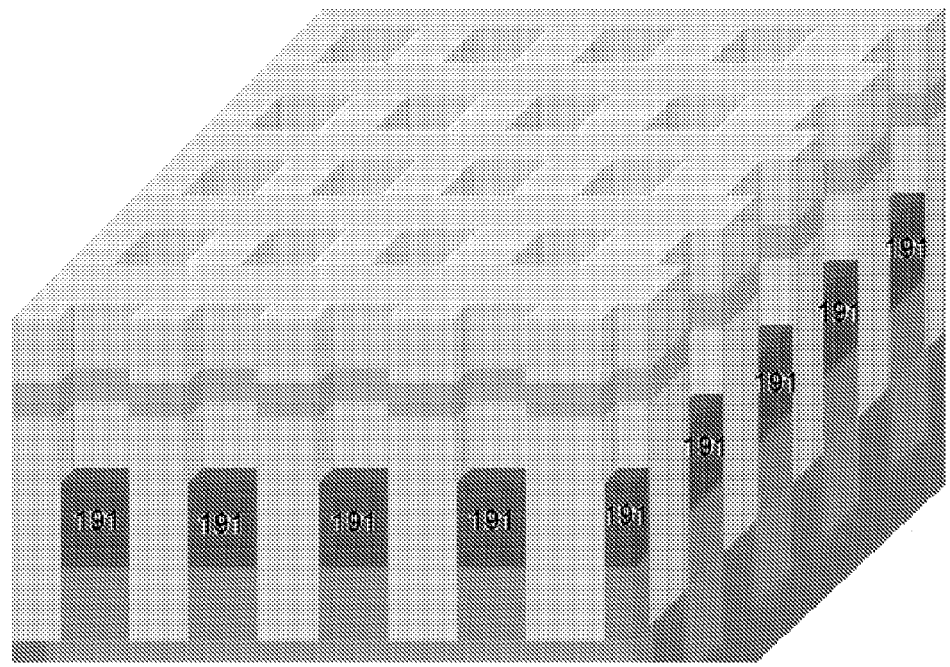
FIG. 19 illustrates the wafer after P-type implantation to form the anodes of the diodes in accordance with an embodiment of the present invention.

In FIG. 12, a deep dielectric etch is performed to form holes 121 down to the bitlines 11 using the remaining polysilicon hardmask material in rows 61 and columns 111 (originally deposited in layers 24 and 71, respectively). Once the holes 121 are etched for the memory cell formation, the remaining hardmask polysilicon (in columns 61 and 111) on the surface is removed by (for example) filling the holes with BARC 131 (as depicted in FIG. 13). BARC may etch at a rate approximately equal to that of the polysilicon hardmask material; a polysilicon/BARC etch, therefore, may remove the surface BARC and the polysilicon hardmask material remaining on the surface (and, in some embodiments, partly remove the BARC material in the holes 121), as depicted in FIG. 14. As depicted in FIG. 15, any BARC remaining in the holes 121 may then be removed with a descum step as is well understood by those skilled in the art. A selective epitaxial silicon growth step is may be used to grow crystalline silicon 161 in the holes all the way to the surface as depicted in FIG. 16. This crystalline silicon 161 may be planarized (e.g., by CMP) as depicted in FIG. 17 and then partly etched back to form cups 181 as depicted in FIG. 18. An implant is next performed to form the P-N junction (or P-i-N junction) of the diodes. For example, if the bitlines 11 are formed of N-type silicon and the epitaxial silicon of the diodes is formed of intrinsic or N-type silicon, the anodes 191 are created by implanting to turn the anodes (tops) of the diodes into P-type silicon as shown in FIG. 19.

Figure 20A:
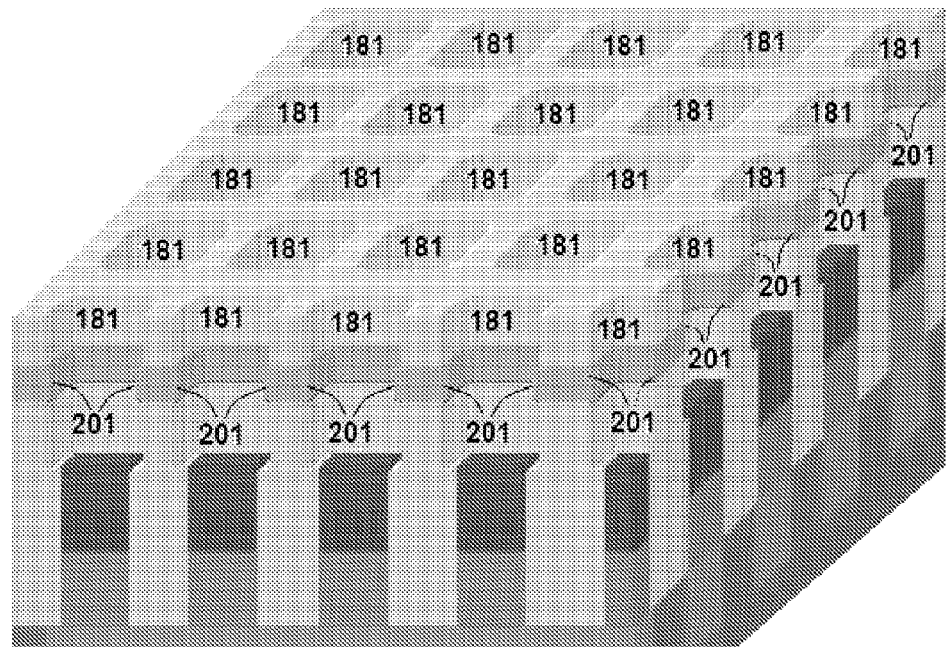
FIGS. 20A-20B illustrate the wafer after an isotropic etch which is selective to etch oxide faster than nitride in accordance with an embodiment of the present invention.
Figure 20B:
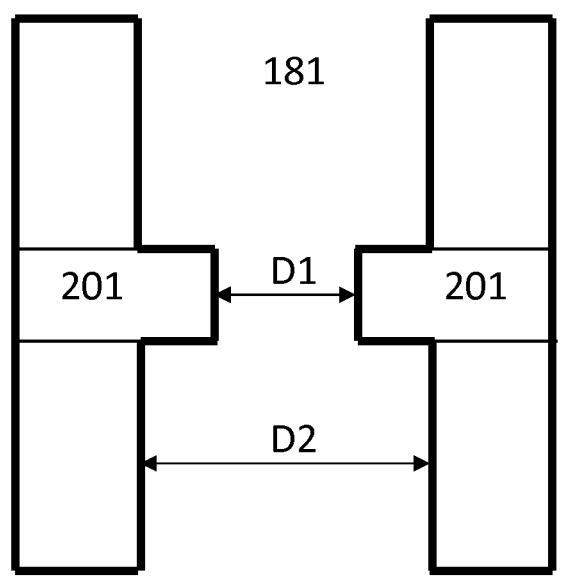
Figure 21:
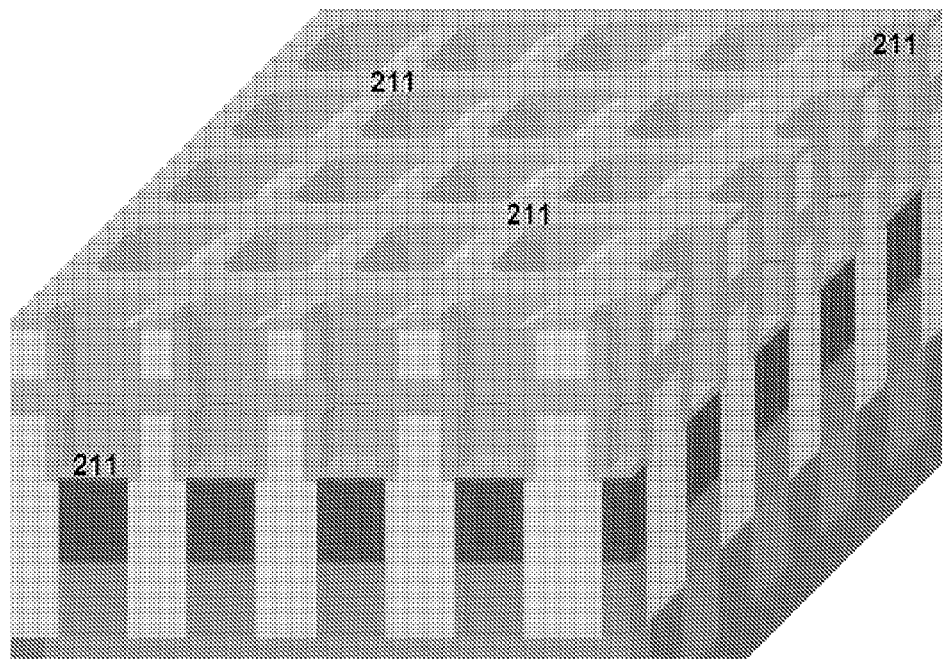
FIG. 21 illustrates the wafer after conformal deposition of nitride in accordance with an embodiment of the present invention.
Figure 22:
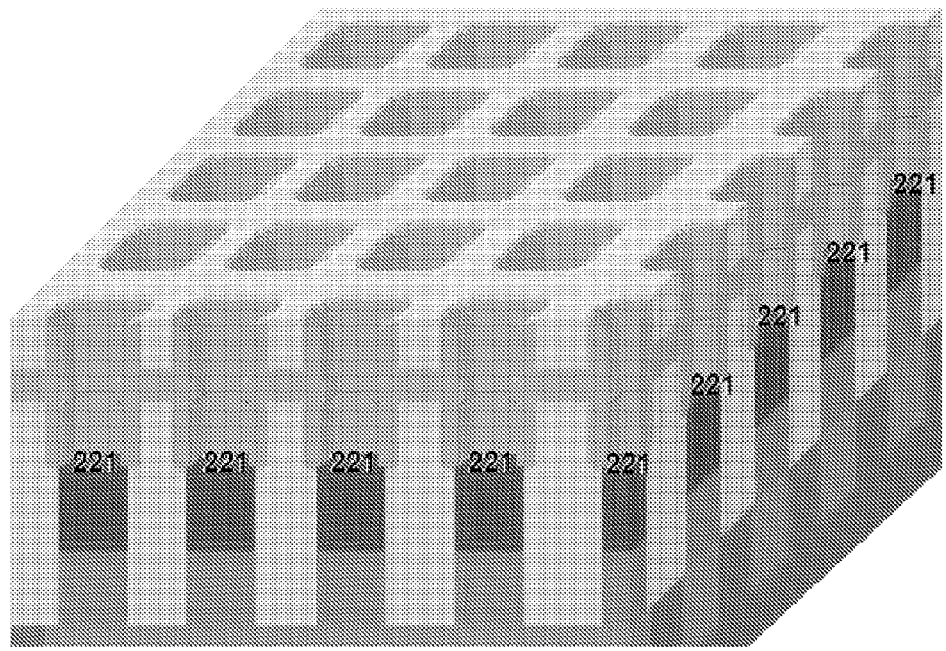
FIG. 22 illustrates the wafer after anisotropic etch-back of the nitride in accordance with an embodiment of the present invention.
Figure 23:
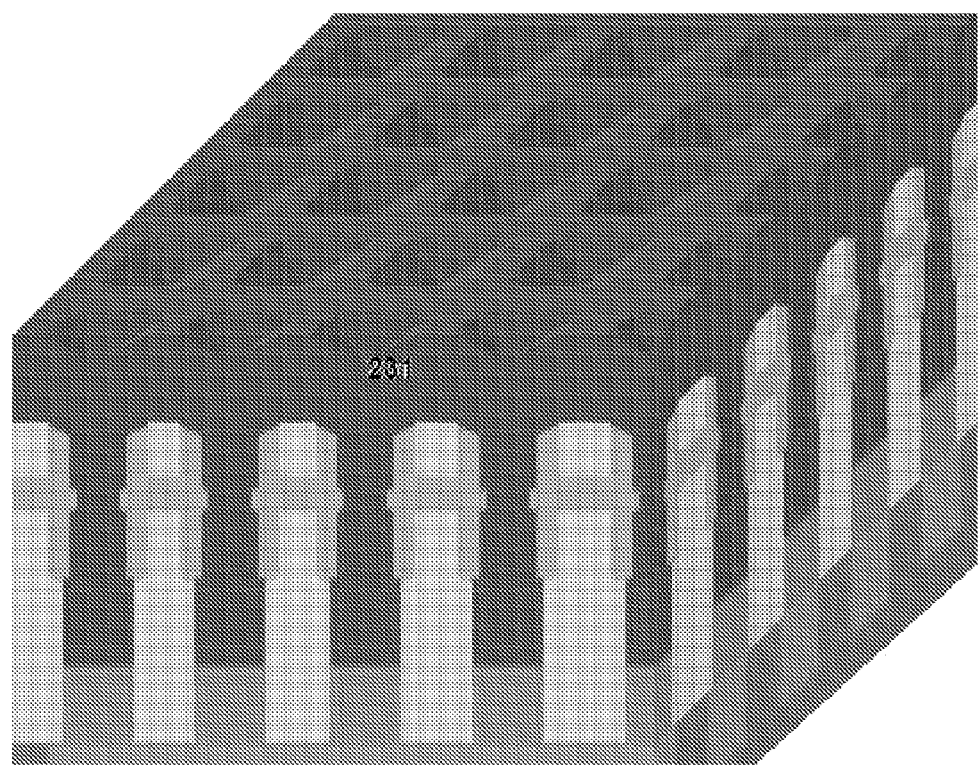
FIG. 23 illustrates the wafer after ALD deposition of GST material in accordance with an embodiment of the present invention.
Figure 24:
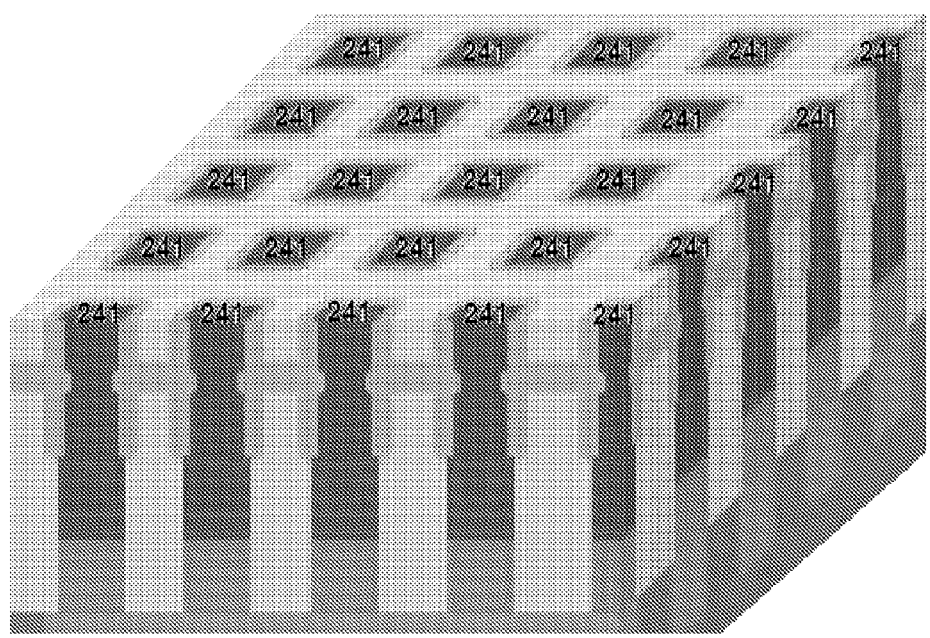
FIG. 24 illustrates the wafer after GST planarization in accordance with an embodiment of the present invention.
Figure 44:
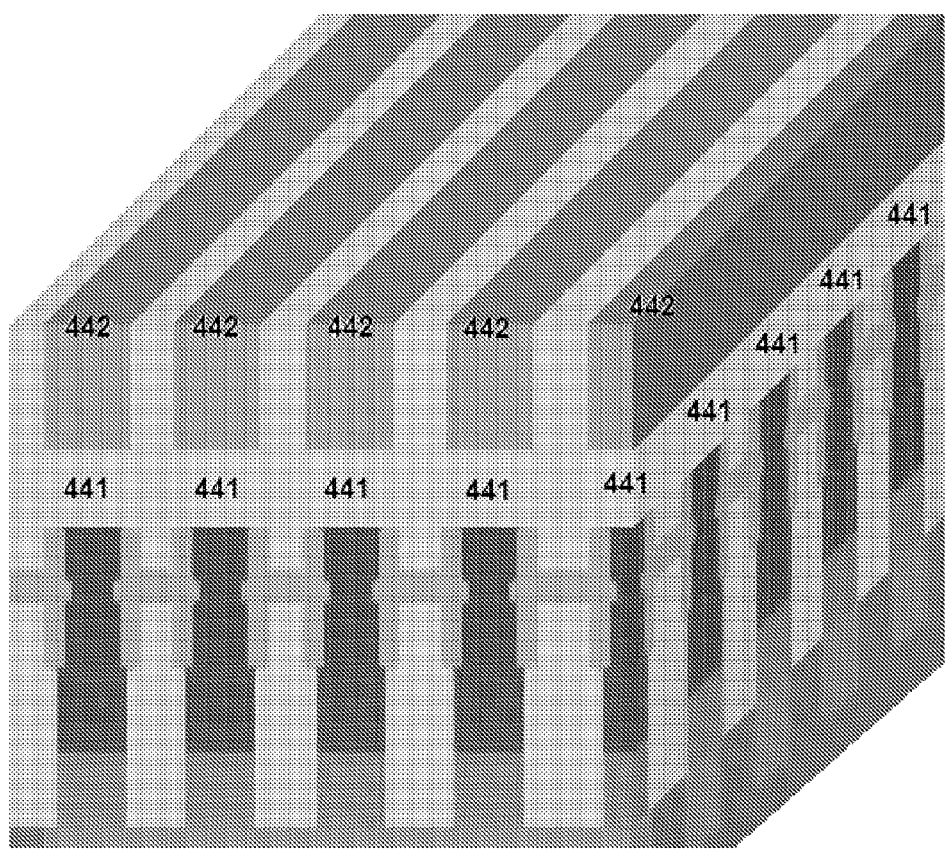
FIG. 44 illustrates the wafer following formation of vias and metal 1 in accordance with an embodiment of the present invention.

In FIG. 20A, the cups 181 are widened by an anisotropic etch, but this etch is selective to etch oxide faster than nitride resulting in a narrow band 201 near the middle of the cup. That is, as also shown in FIG. 20B, a diameter D2 of the cups 181 is greater for the portions of the cups 181 in which the sidewalls of said cups 181 are constructed with oxide, and a diameter D1 is smaller for the portion of the cups 181 in which the sidewalls of said cups are constructed with nitride. This narrowing near the center of the cup will result in an increase in current density in the final device. To further enhance this effect, a conformal layer of silicon nitride 211 is deposited (e.g., by ALD as depicted in FIG. 21) and then etched back to expose the top contact 221 of the diode's anode (e.g., by an isotropic spacer etchback as is well known to those skilled in the art as depicted in FIG. 22). Note that this etch back removes a portion of the nitride narrowing spacer band 201 where a top surface of that spacer is exposed to this vertical etch. To prevent the removal of this narrowing band, the height of the initial layer 22 must be large enough to absorb any over-etch needed to assure that the anode contact is cleared. The cups are then filled by ALD or the like with the information storage element material 231 such as a chalcogenide alloy like GST as is known to those skilled in the art and as is depicted in FIG. 23. This is then planarized (e.g., by CMP) as is depicted in FIG. 24 to form individual information storage elements 241 at each memory cell. From this point to the end of the process, standard processing (e.g., back end of line, BEOL, processing) is utilized to pattern and create top contacts and vias 441 and metal column lines 442 for the cross-point selection of individual memory cells (as depicted in FIG. 44).

The above description of an embodiment of the present invention enables the patterning and creation of memory cell elements using only two critical masks and in a way that creates the volume in which the cell is created such that the dimensions of that volume do not suffer from the variation inherent in a photolithographic patterning process. The width and length of the volume in which the memory cell is formed is determined by the thickness in conformal deposition steps (as depicted in FIGS. 4 and 9). While this sequence of steps results in a precisely dimensioned opening in which to form a memory cell, the squared off corners surrounding the volume wherein the epitaxially grown silicon for the diodes is deposited may result in stacking faults in that deposited silicon which could cause leakage currents. To address this, a slight modification to the above sequence of steps enables rounding of these corners while keeping the essence of the present invention as described above. A first such modification approach would be to add a spacer deposition and etch back sequence, as is done around the gates of small feature MOS transistors and is well known to those skilled in the art. This would involve depositing a thin conformal coating of nitride or other non-conductive or dielectric material in the hole prior to epi-silicon growth (i.e., at the point depicted by FIG. 15). Such a conformal deposition (very much like the conformal deposition depicted at FIG. 21) will not significantly reduce the size of the hole opening, but will be thickest in the corners of the hole where the material contacts two walls, resulting in a rounding of those corners. This deposition would be followed by a brief isotropic etch (very much like the conformal deposition depicted at FIG. 22) to clear the silicon surface at the bottom of the hole where the epi-silicon would be selectively grown. A second modification approach is as follows.

Figure 25:
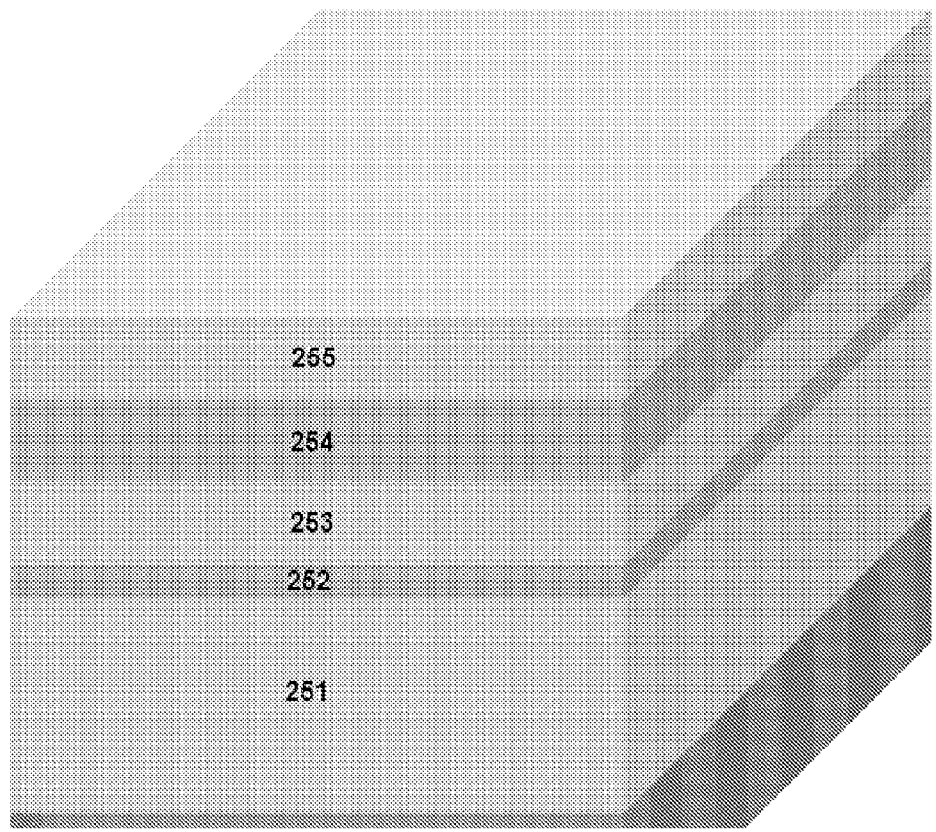
FIGS. 25-43 illustrate alternative steps corresponding to the steps depicted in FIGS. 2-12 in accordance with an embodiment of the present invention.
Figure 26:
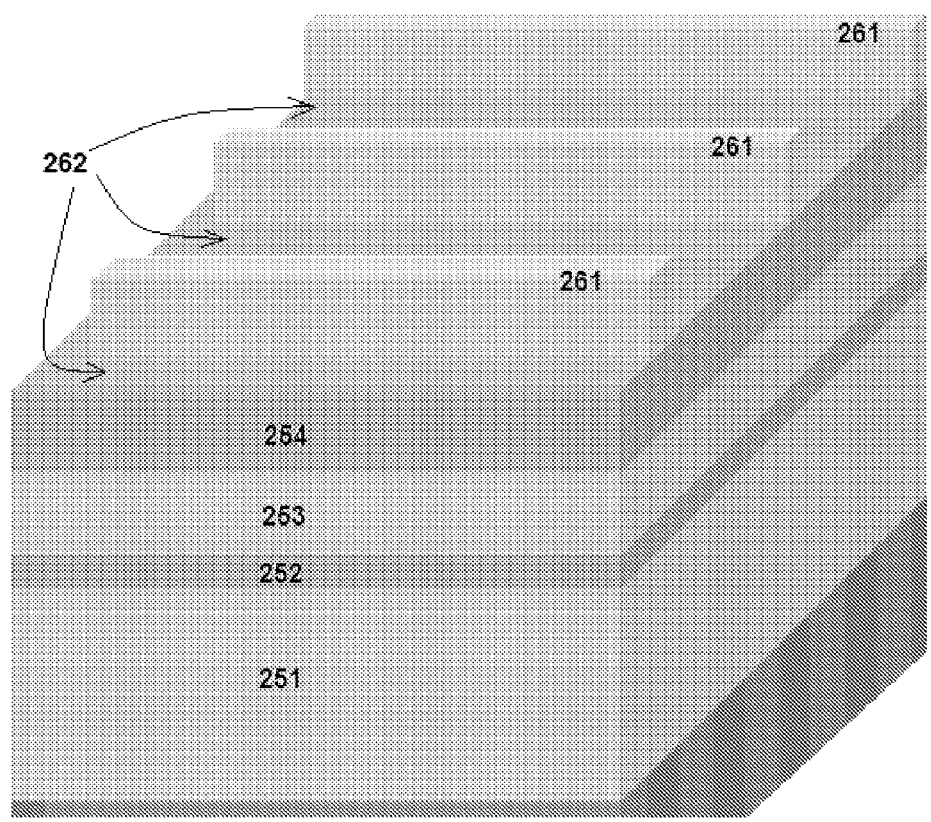
Figure 27:
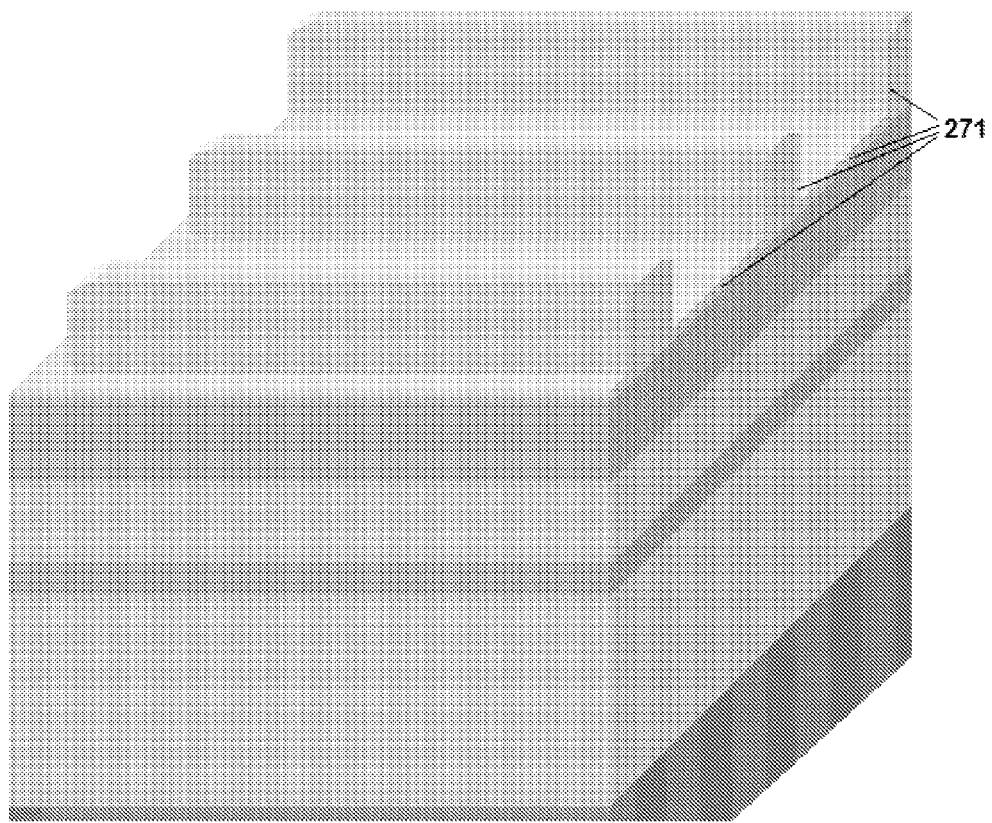
Figure 28:
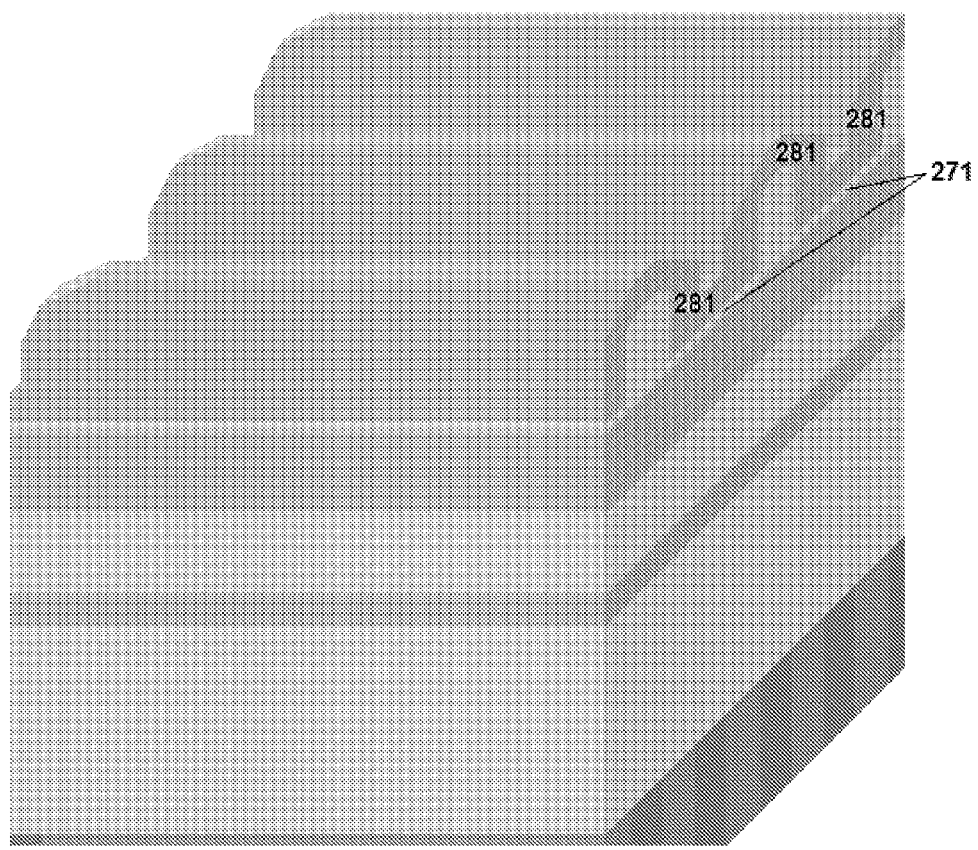
Figure 29:
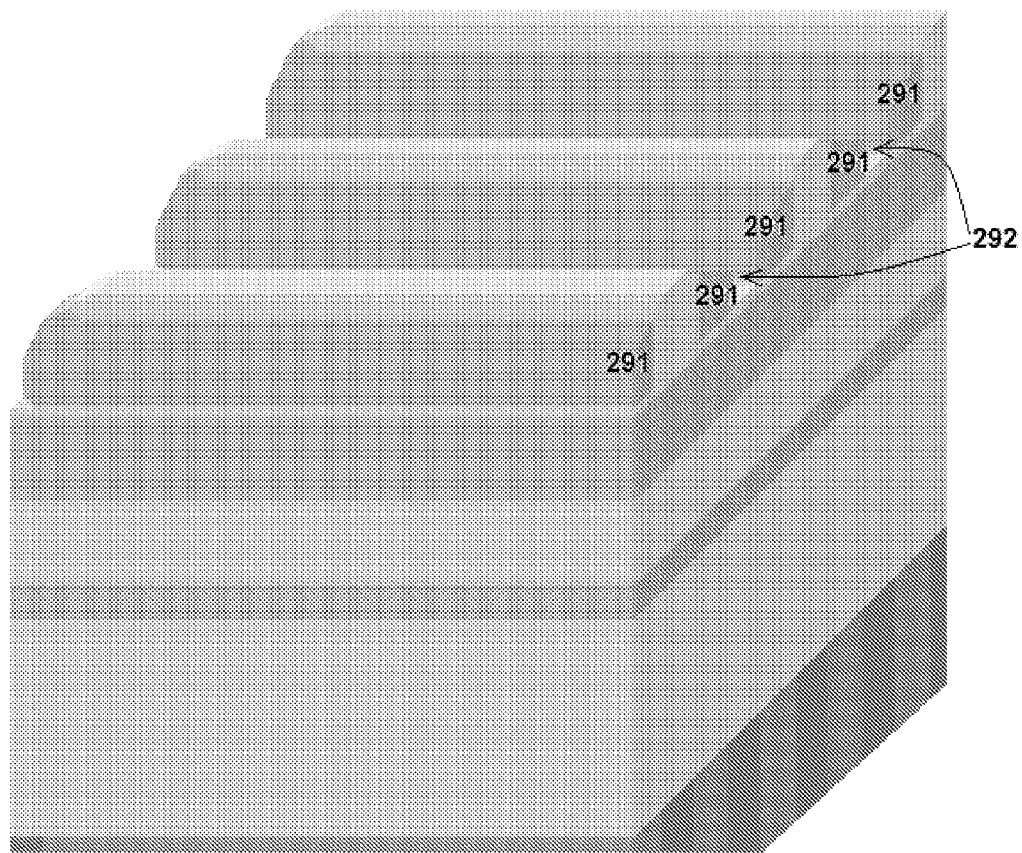
Figure 30:
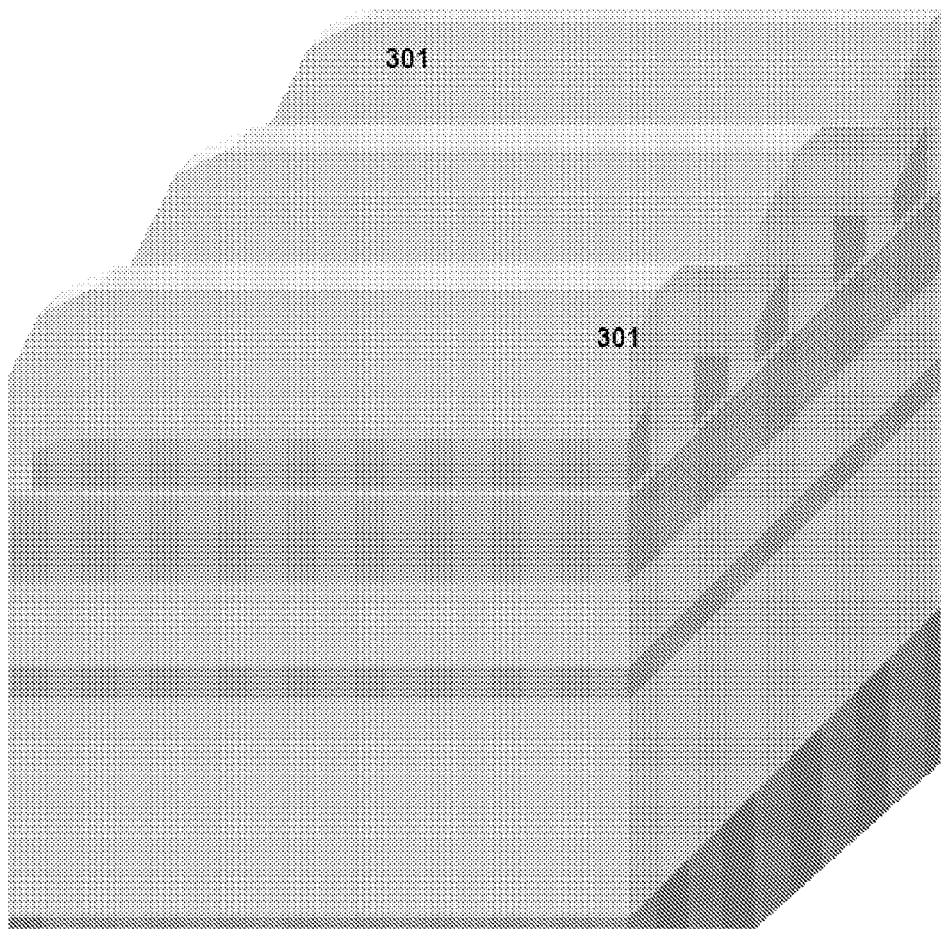

FIG. 25 again shows this portion of the wafer at the point after that depicted in FIG. 1. In this instance, a series of layers such as silicon oxide 251, silicon nitride 252, silicon oxide 253, polysilicon 254 (to be used later as a hardmask), and silicon oxide top mask material 255 is deposited. This top mask oxide material 255 is patterned and etched into rows 261 (these rows are generally positioned above every other space 12 between the bitlines 11. As depicted in FIG. 26, by forming these top mask oxide material rows 261 above every other space 12 (each row 261 having generally the same width as the underlying space 12 less a "cushion thickness", as described below), the spaces 262 between the top mask oxide material rows 261 are be more than three times as wide as the top mask oxide material rows 261 themselves and, as a result, the photolithographic difficulty to pattern these top mask oxide material rows 261 is reduced, and double patterning to form these rows may be avoided. Note that the reduction of the width of the rows by a "cushion thickness" may be achieved by slightly overexposing the photolithographic patterning of those rows. This "cushion thickness" is put back (as depicted in FIG. 27) with the deposition (e.g., by ALD) of a conformal layer of silicon oxide 271 equal in thickness to that "cushion thickness." While this restores the width of the rows to that which was patterned according to the steps corresponding to FIG. 3, the benefit is that in this case, a layer of etch stop material 271 is formed in the bottom of the spaces 262. In FIG. 28, this etch stop layer 271 is more easily visible under a deposited layer of conformal polysilicon 281. This etch stop layer 271 is deposited with a precision deposition process such as atomic layer deposition (ALD) having a thickness equal to the desired feature size (in this case, a measure across the holes to be formed to fabricate the memory cells). This deposited etch stop layer of conformal polysilicon 281 is etched back (as depicted in FIG. 29) using a side-wall spacer etch-back technique as is well understood by those skilled in the art. A layer of silicon oxide 301 is next deposited across the wafer to fill in the spaces 292 between deposited sidewalls 291, as shown in FIGS. 29 and 30.

Figure 31:
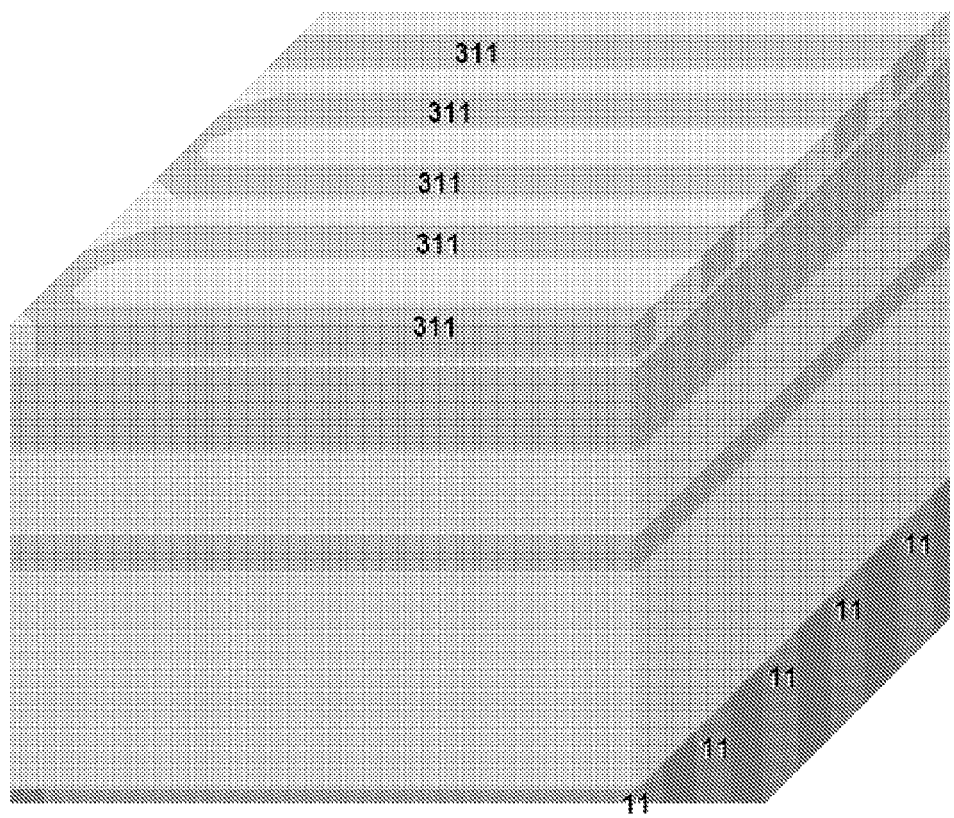

As shown in FIG. 31, the wafer is planarized (e.g., as by chemical-mechanical polishing, CMP) to form rows 311 of hardmask material above the bitlines 11. Note that there is now a polysilicon row 311 above each bitline 11; these polysilicon rows 311 were formed by forming rows of sidewall spacers from the deposited layer of polysilicon 281.

Figure 32:
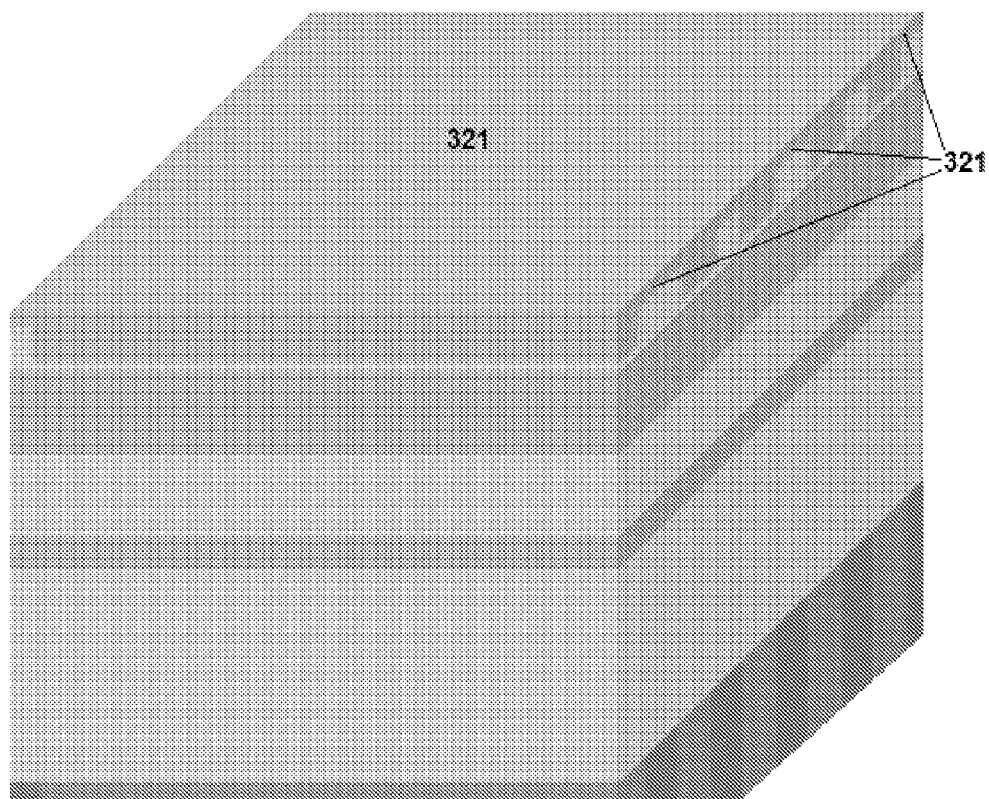
Figure 33:
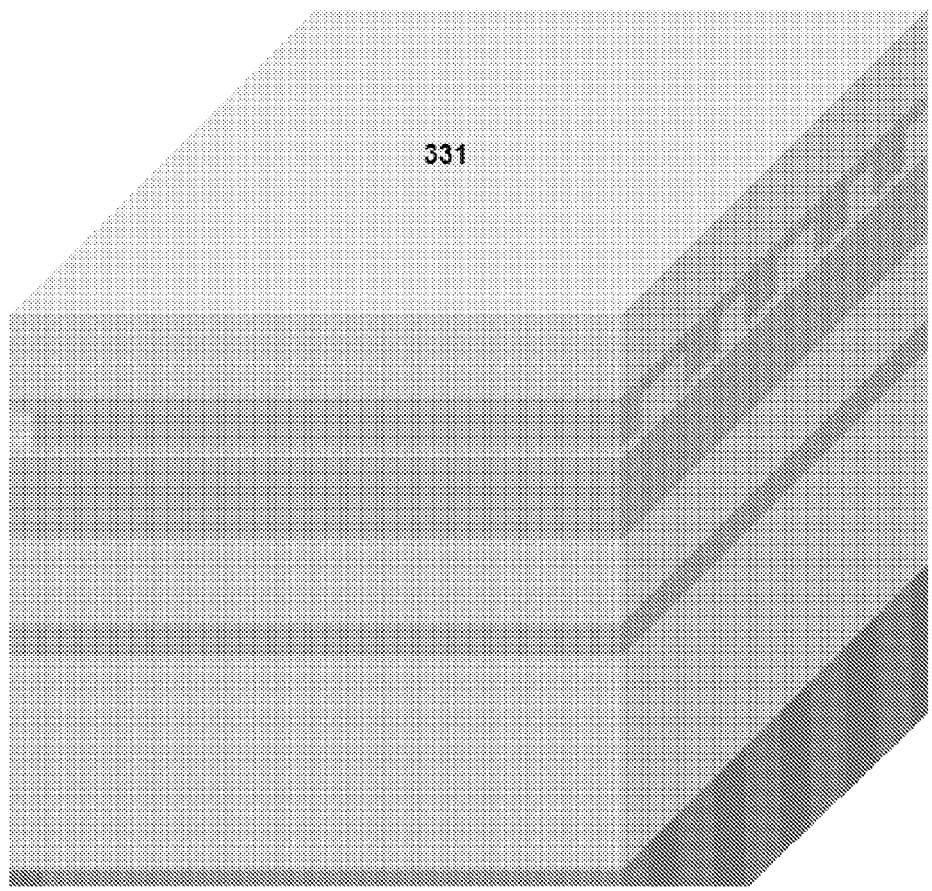

In FIG. 32, a layer of polysilicon 321 is deposited to form an etch stop and, in FIG. 33, a layer of silicon oxide 331 is deposited in preparation of generally repeating the steps depicted in FIGS. 26 through 31 for an orthogonal hardmask pattern.

Figure 34:
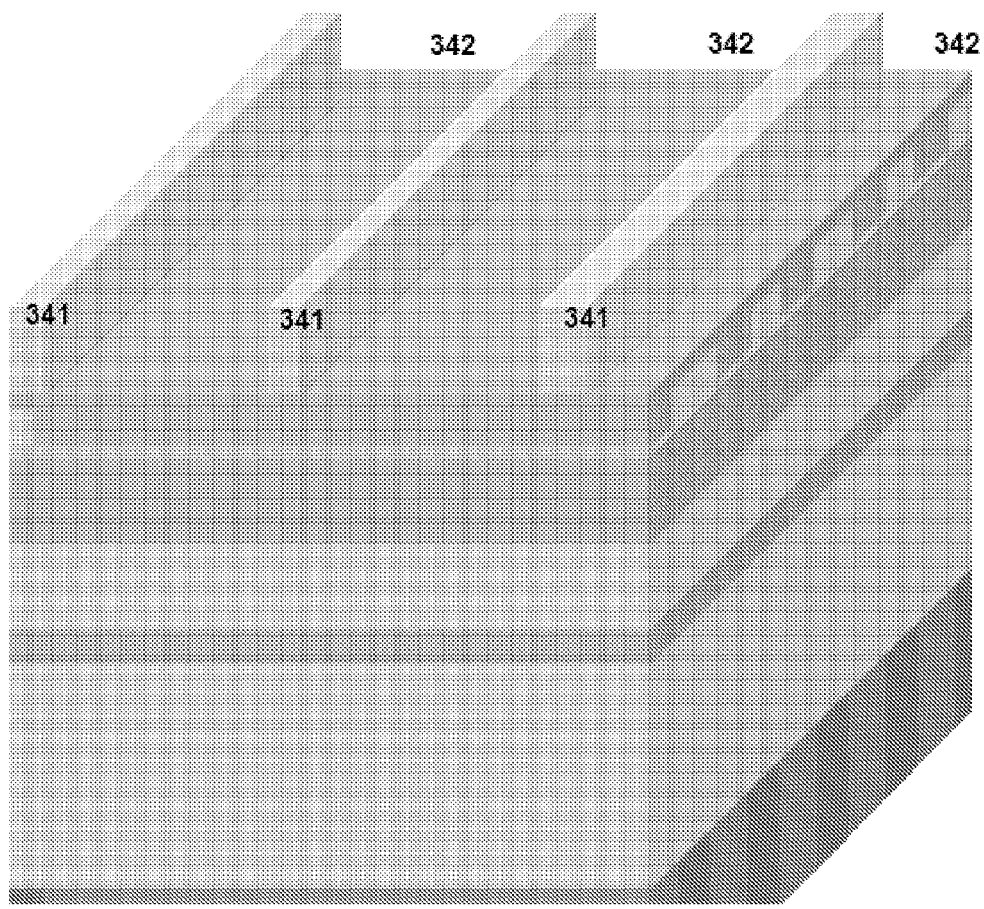
Figure 35:
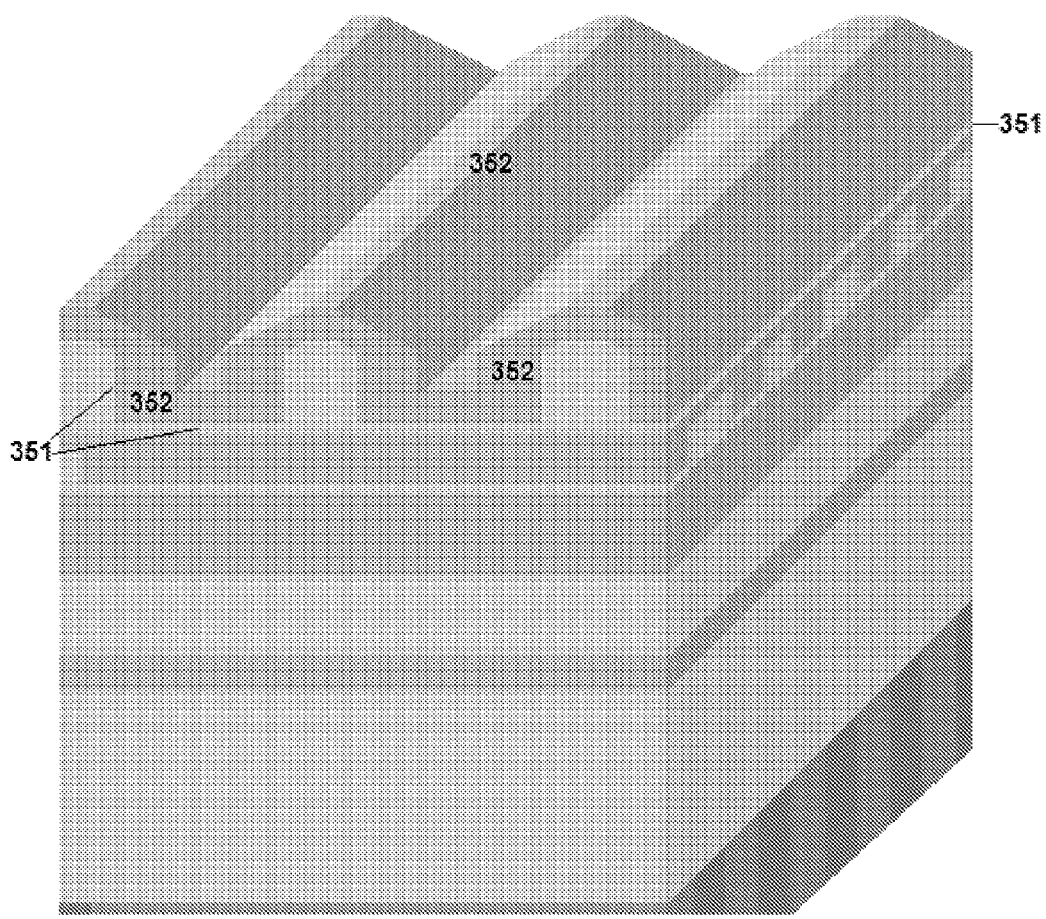
Figure 36:
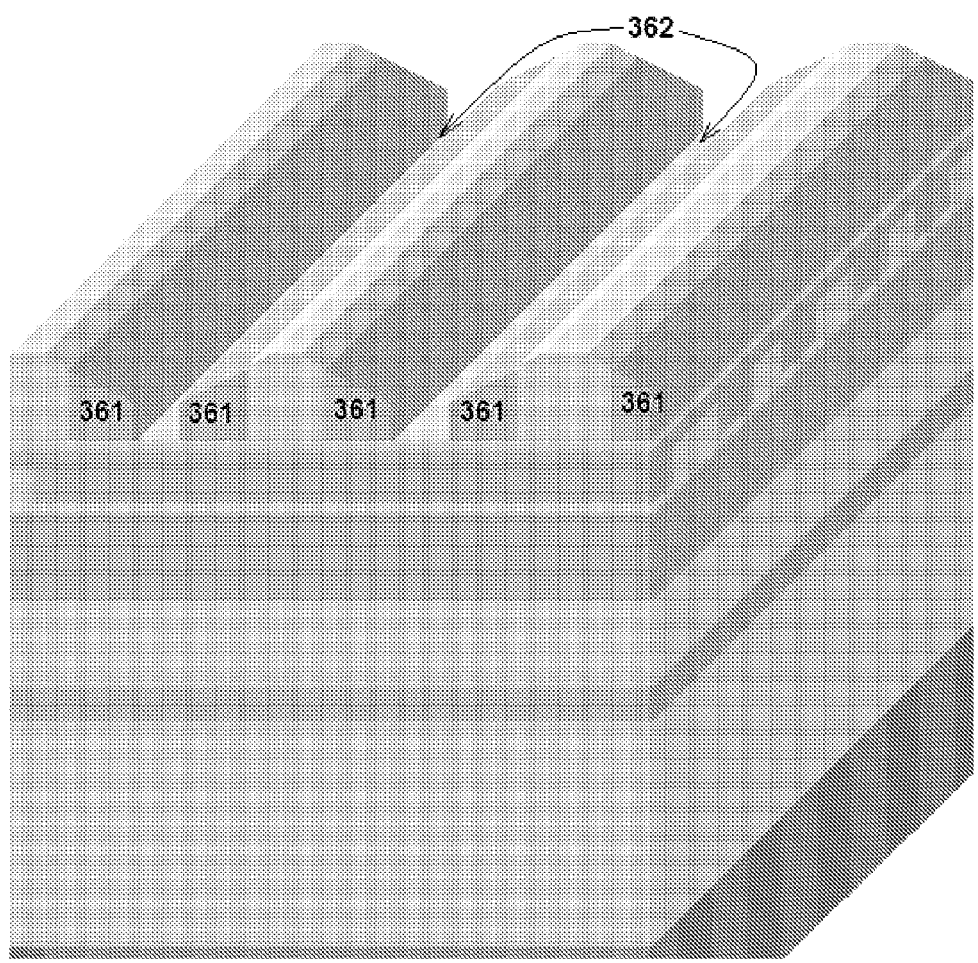

As depicted in FIG. 34, this silicon oxide 331 is patterned and etched into columns 341 (these columns are generally positioned where every other space between the memory cells are to be formed). As was depicted in FIG. 26 and as is now depicted here in FIG. 34, by forming these top mask oxide material columns 341 above every other space between the memory cells (each column 341 having generally the same width as the underlying space between the memory cells less a "cushion thickness," as was described above), the spaces 342 between the top mask oxide material columns 341 may be more than three times as wide as the top mask oxide material columns 341 themselves and, as a result, the photolithographic difficulty to pattern these top mask oxide material columns 341 is reduced and double patterning to form these columns may well be avoided. Note that the reduction of the width of the columns by a "cushion thickness" can be achieved by slightly overexposing the photolithographic patterning of those columns. This "cushion thickness" is put back (as depicted in FIG. 35) with the deposition (e.g., by ALD) of a conformal layer of silicon oxide 351 equal in thickness to that "cushion thickness." While this restores the width of the columns to that which was patterned according to the steps corresponding to FIG. 3, the benefit is that in this case, a layer of etch stop material 351 is formed in the bottom of the spaces 342. In FIG. 35, this etch stop layer 351 is more easily visible under a deposited layer of conformal polysilicon 352. This etch stop layer 352 is deposited with a precision deposition process such as atomic-layer deposition (ALD) having a thickness equal to the desired feature size (in this case, a measure across the holes to be formed to fabricate the memory cells). This deposited etch stop layer of conformal polysilicon 352 is etched back (as depicted in FIG. 36) using a side-wall spacer etch-back technique as is well understood by those skilled in the art. A layer of silicon oxide is next deposited across the wafer to fill in the spaces 362 between deposited sidewalls 361.

Figure 37:
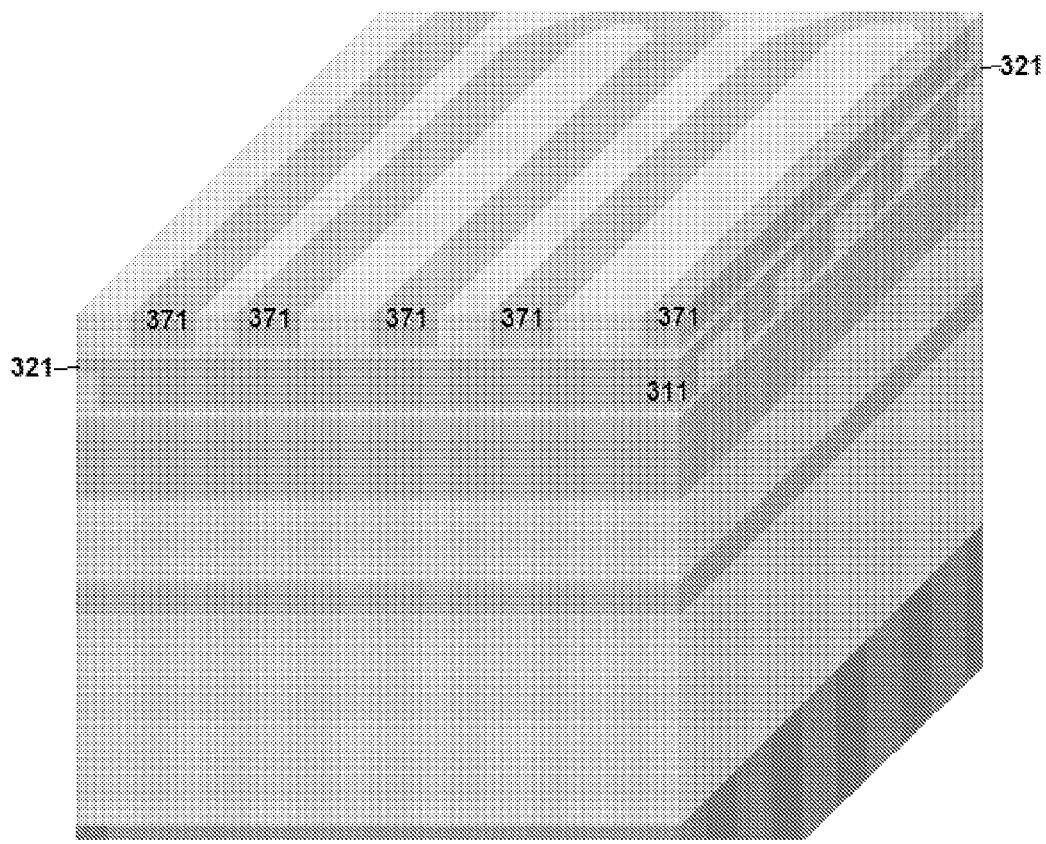

As shown in FIG. 37, the wafer is planarized (e.g., by chemical-mechanical polishing or CMP) to form columns 371 of hardmask material above the spaces between the memory cells, similar to (but orthogonal to) the rows of hardmask material depicted in FIG. 31.

Figure 38:
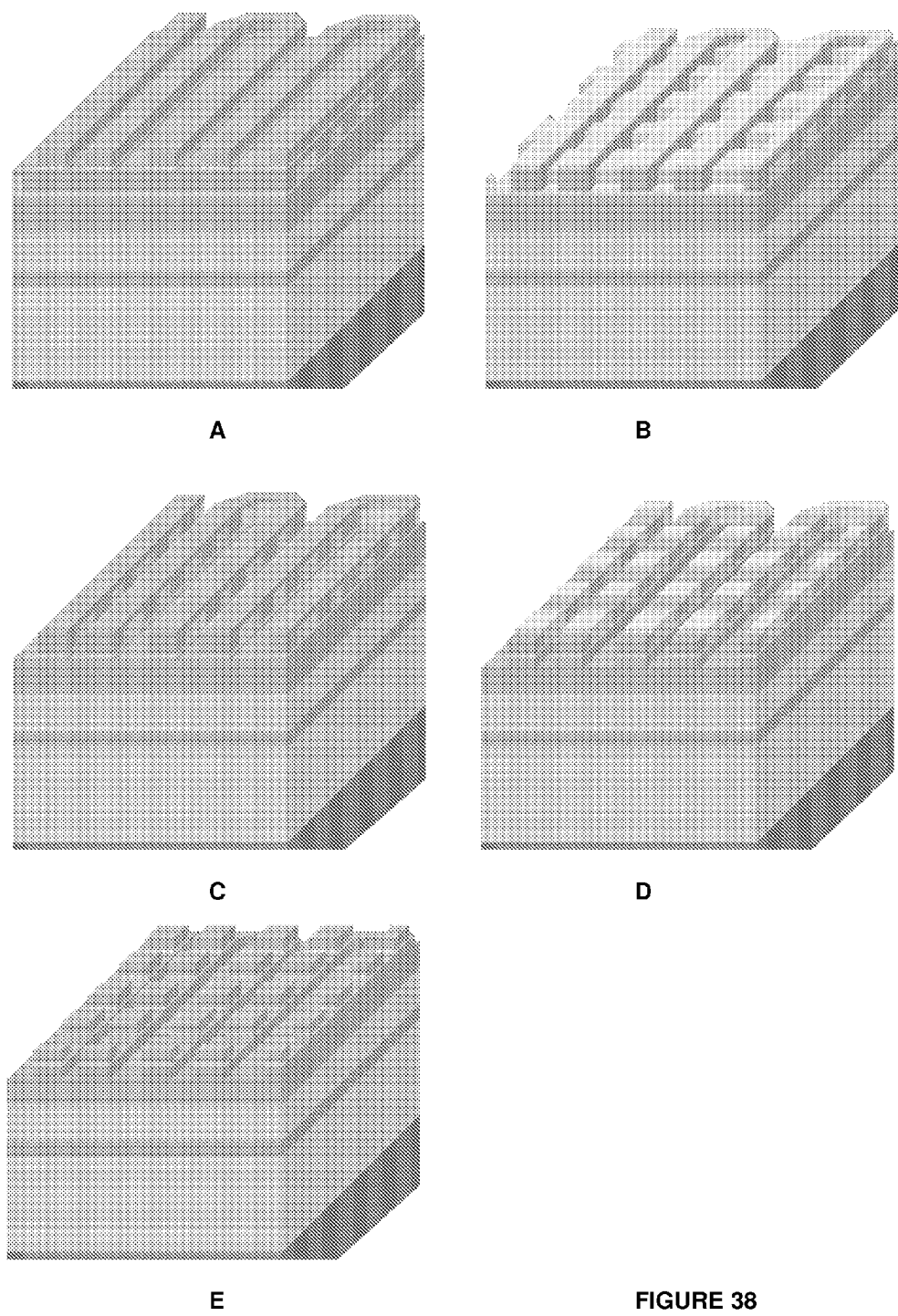

FIG. 38 depicts a series of directional (i.e., anisotropic) etches alternating between oxide etches and silicon etches. In FIG. 38A, an oxide etch removes surface oxide to stop on and expose the underlying hardmask layer formed of polysilicon 321 and 311. In FIG. 38B, a silicon etch removes now-exposed hardmask material, stopping on oxide. In FIG. 38C, this oxide-stopping material is removed using another oxide etch to stop on and expose a second complex hardmask. In FIG. 38D, a short-timed silicon etch is performed, timed to just remove the surface hardmask material that connects the small cubes of surface hardmask material above each memory cell. Finally, in FIG. 38E, an oxide etch removes any remaining surface oxide.

Figure 39:
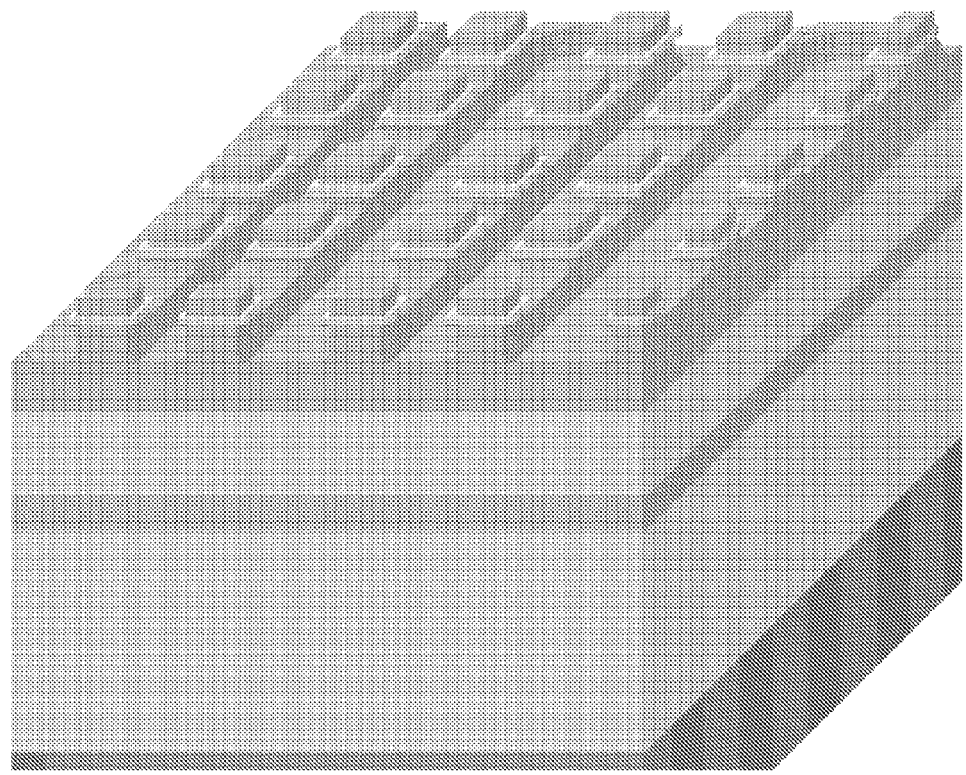
Figure 40:
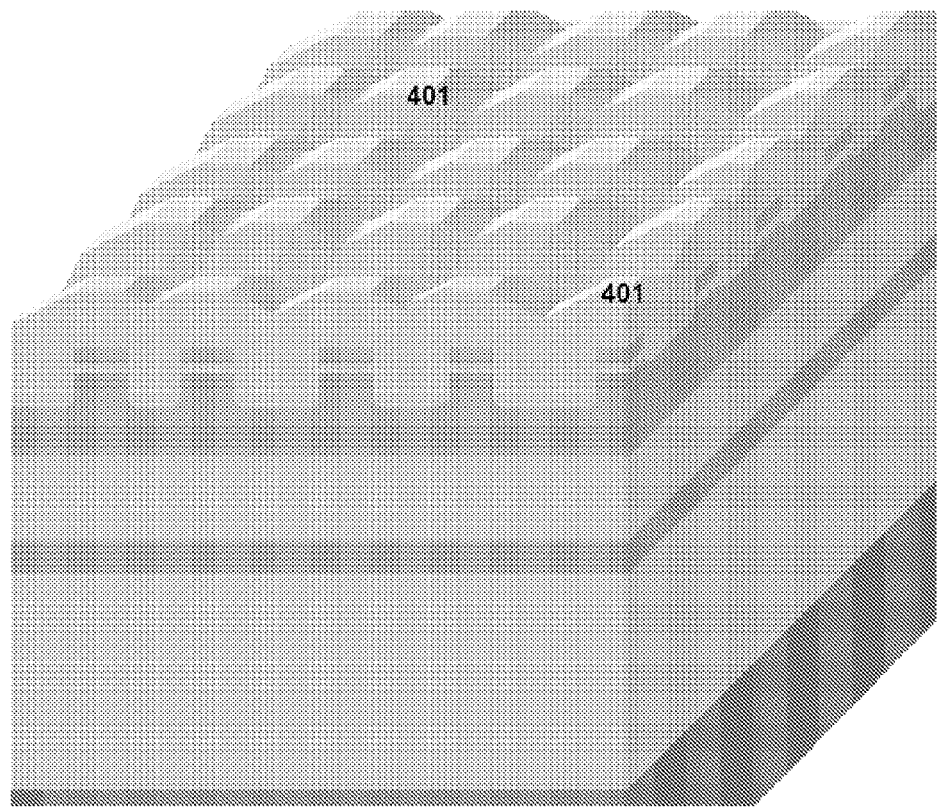
Figure 41:
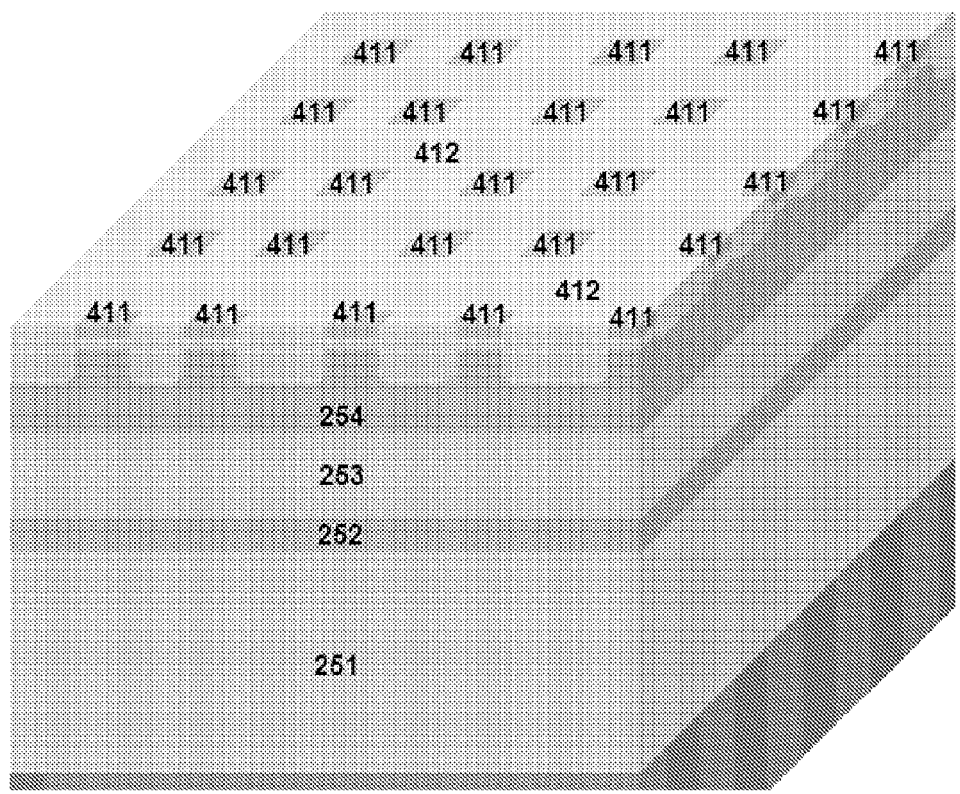
Figure 42:
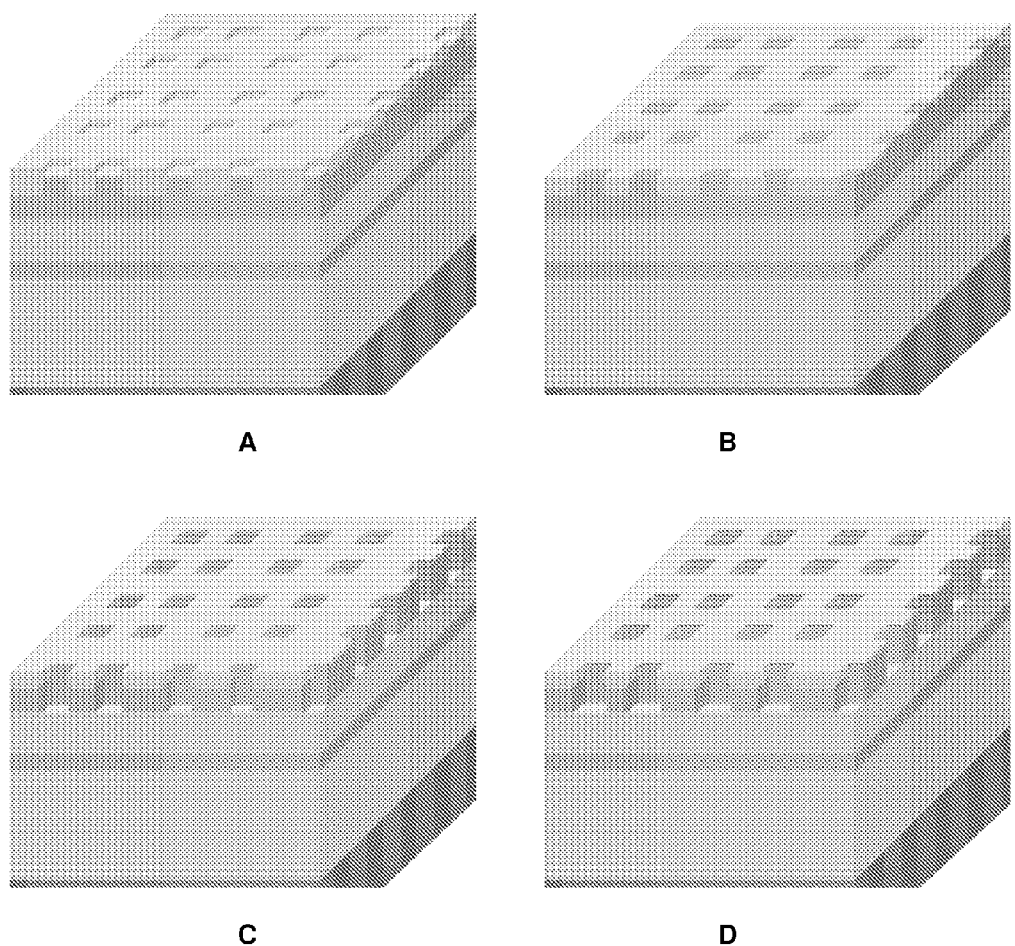

FIG. 39 depicts the wafer following a short non-directional (i.e., isotropic) etch. This brief, timed etch removes a small amount of the exposed hardmask material such that the corners of the structures (which are exposed on two sides) are removed faster and, resultantly, are rounded off. This step is followed by the deposition of a conformal layer of oxide 401 (as depicted in FIG. 40) which is then planarized (as depicted in FIG. 41) resulting in a square (with rounded corners) 411 of hardmask material above each memory cell surrounded by oxide 412. This oxide 412 may serve as an etchmask when openings are formed through hardmask layer 254 (as depicted in FIG. 42); the resulting hardmask formed from layer 254 facilitates the formation of deep holes (through layers 253, 252 and 251) to form the memory cells.

Figure 43:
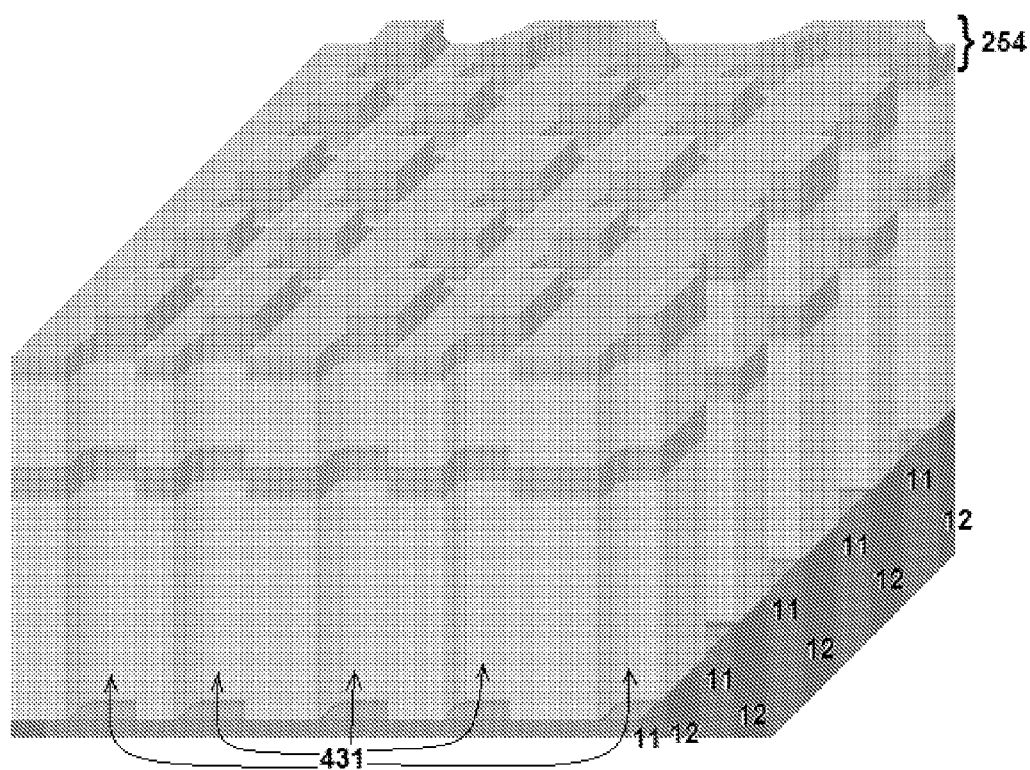

First, as depicted in FIG. 42A, the exposed round-corner squares of hardmask material are removed using a silicon etch. Second, as depicted in FIG. 42B, a brief, timed oxide etch removes the small layer of oxide remaining below each of the exposed round-corner squares of hardmask material just removed, but without removing all of the oxide that was between the exposed round-corner squares of hardmask material just removed. Alternatively, the exposed round-corner squares of hardmask material and the small layer of oxide remaining below each of the exposed round-corner squares of hardmask material may be removed by extending the planarization step described in the step corresponding to FIG. 41. As depicted in FIG. 42C, a directional (i.e., anisotropic) silicon etch is next used to remove the hardmask material above each memory cell. Optionally, as depicted in FIG. 42D, a brief non-directional (i.e., isotropic) silicon etch may also be performed to further round the corners of the openings in the hardmask layer. Finally, as depicted in FIG. 43 (as was done in the step corresponding to FIG. 12), a deep dielectric etch is performed to form holes 431 down to the bitlines 11 using the remaining polysilicon hardmask material from layer 254. Once the holes 431 are etched for the memory cell formation, the process continues with those steps corresponding to FIGS. 13 through 24, and then, from that point to the end of the process using standard processing (e.g., back end of line or "BEOL" processing) to pattern and create top contacts and metal column lines for the cross-point selection of individual memory cells (as depicted in FIG. 44).

Figure 45:
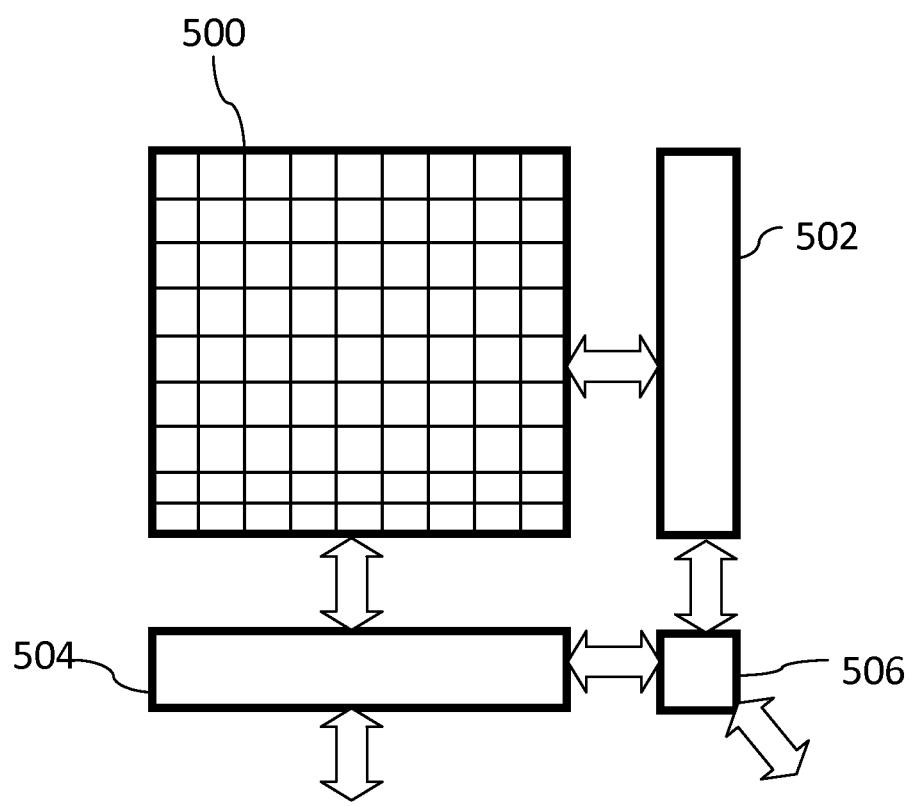
FIG. 45 illustrates a block diagram of a memory array and surrounding circuitry in accordance with an embodiment of the present invention.

The present invention may be used to implement crosspoint memory arrays wherein the memory arrays' surrounding circuitry is also implemented using embodiments of the present invention; these arrays may be one of many tiles or sub-arrays in a larger device or an array within a 3-D arrangement of arrays or tiles. In such a memory device, the storage cells can incorporate field-emitters, diodes or other non-linear conductor devices that conduct current better in one direction than the other for a given applied voltage. The non-linear conductive devices of the memory array, while typically include diodes, may alternatively be constructed as three-layer devices (e.g., bipolar transistors) or four-layer devices (e.g., P-N-P-N diodes or SCRs). FIG. 45, for example, is a block diagram of an array 500 constructed in accordance with any of the above embodiments of the present invention; a row read-write circuit 502 and a column read-write circuit 504 may be similarly constructed. The row/column circuits 502, 504 may include sense amps, drivers, or any other such circuits known in the art. Other circuits 506 may also be included, such as memory/bus I/O circuits or any other circuits known in the art.

The storage element may be a fuse, an antifuse, a resistance-change material such as a phase-change material (including a chalcogenide in which the programmed resistivity can be one of two resistance values and, in the case of more than one bit per cell storage cells, in which the programmed resistivity can be one of three or more resistance values), a resistance that can be altered electrically or by heating, or a field-emitter element programming mechanism including an element for which the resistance or the volume is changeable and programmable.

Memory devices incorporating embodiments of the present invention may be applied to memory devices and systems for storing digital text, digital books, digital music (such as MP3 players and cellular telephones), digital audio, digital photographs (wherein one or more digital still images can be stored including sequences of digital images), digital video (such as personal entertainment devices), digital cartography (wherein one or more digital maps can be stored, such as GPS devices), and any other digital or digitized information as well as any combinations thereof.

Devices incorporating embodiments of the present invention may be embedded or removable, and may be interchangeable among other devices that can access the data therein. Embodiments of the invention may be packaged in any variety of industry-standard form factor, including compact flash, secure digital, multimedia cards, PCMCIA cards, memory stick, any of a large variety of integrated circuit packages including ball-grid arrays, dual in-line packages (DIPs), SOICs, PLCCs, TQFPs, and the like, as well as in proprietary form factors and custom designed packages. These packages can contain just the memory chip, multiple memory chips, one or more memory chips along with other logic devices or other storage devices such as PLD's, PLA's, micro-controllers, microprocessors, controller chips or chipsets or other custom or standard circuitry.

Systems incorporating memory devices comprising embodiments of the present invention have the advantages of high density, non-volatile memory. Such systems could provide long term storage as a solid state storage device instead of or in addition to rotating media storage (e.g., magnetic disks, read only or read/write optical disks, and the like) and/or network based storage. Such systems could be in the form of a desk-top computer system, a hand-held device (such as a tablet computer or a laptop computer), a communication device (such as a cell phone, a smart phone, a portable wirelessly networked device for music, video or other purposes, or the like), and/or any other system based device having data storage.

The foregoing description of an example of embodiments of the present invention; variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A method for forming an array, the method comprising:
   forming a plurality of rows of hardmask material above one or more layers of insulating material;
   forming a plurality of columns of hardmask material above the plurality of rows of hardmask material;
   etching holes in the one or more layers of insulating material using the combined masking properties of the rows of hardmask material and the columns of hardmask material; and
   forming memory cells in the holes,
   wherein a first subset of the plurality of rows are formed by a lithographic step and wherein a second subset of the plurality of rows are thereafter formed by a deposition step,
   wherein the second subset of the plurality of rows are deposited between the first subset of the plurality of rows; and
   wherein the first subset of the plurality of rows are separated by a distance corresponding to at least double a distance between array bitlines.

2. The method of claim 1, wherein forming the plurality of rows of hardmask material comprises forming a plurality of rows of insulating material and depositing a layer of hardmask material on top of the plurality of rows of insulating material.

3. The method of claim 1, wherein a first subset of the plurality of columns are formed by a lithographic step and wherein a second subset of the plurality of columns are thereafter formed by a deposition step.

4. The method of claim 3, wherein the deposition step comprises forming sidewall hardmask features on the sides the first subset of the plurality of columns and depositing the second subset of the plurality of columns, wherein a thickness of sidewall material in the sidewall hardmask features is defined by the deposition step.

5. The method of claim 1, wherein etching the holes comprises performing a selective etch of the insulating material, wherein the insulating material comprises at least two different types of insulating materials, and wherein the selectively etched hole comprises a first diameter etched in a first type of insulating material and a second diameter larger than the first diameter etched in a second type of insulating material.

6. The method of claim 1, further comprising forming an electronic circuit in electrical communication with the array.

7. An electronic circuit in the form of an array comprising features that have been formed by forming a plurality of rows of hardmask material above one or more layers of insulating material, forming a plurality of columns of hardmask material above the plurality of rows of hardmask material, etching holes in the one or more layers of insulating material using the combined masking properties of the rows of hardmask material and the columns of hardmask material, and forming memory cells in the holes, wherein a first subset of the plurality of rows are formed by a lithographic step and wherein a second subset of the plurality of rows are thereafter formed by a deposition step, and wherein the second subset of the plurality of rows are deposited between the first subset of the plurality of rows:
    wherein the first subset of the plurality of rows are separated by a distance corresponding to double a distance between array bitlines.

8. The electronic circuit of claim 7, wherein forming the plurality of rows of hardmask material comprises forming a plurality of rows of insulating material and depositing a layer of hardmask material on top of the plurality of rows of insulating material.

9. The electronic circuit of claim 7, wherein a first subset of the plurality of rows are formed by a lithographic step and wherein a second subset of the plurality of rows are thereafter formed by a deposition step.

10. The electronic circuit of claim 9, wherein the deposition step comprises forming sidewall hardmask features on the sides the first subset of the plurality of rows and depositing the second subset of the plurality of rows, wherein a thickness of sidewall material in the sidewall hardmask features is defined by the deposition step.

11. The electronic circuit of claim 7, wherein a first subset of the plurality of columns are formed by a lithographic step and wherein a second subset of the plurality of columns are thereafter formed by a deposition step.

12. The electronic circuit of claim 11, wherein the deposition step comprises forming sidewall hardmask features on the sides the first subset of the plurality of columns and depositing the second subset of the plurality of columns, wherein a thickness of sidewall material in the sidewall hardmask features is defined by the deposition step.

13. An electronic system comprising one or more array circuits, the array circuits comprising features that have been formed by forming a plurality of rows of hardmask material above one or more layers of insulating material, forming a plurality of columns of hardmask material above the plurality of rows of hardmask material, etching holes in the one or more layers of insulating material using the combined masking properties of the rows of hardmask material and the columns of hardmask material, and forming memory cells in the holes, wherein a first subset of the plurality of rows are formed by a lithographic step and wherein a second subset of the plurality of rows are thereafter formed by a deposition step, and wherein the second subset of the plurality of rows are deposited between the first subset of the plurality of rows;
    wherein the first subset of the plurality of rows are separated by a distance corresponding to double a distance between array bitlines.

14. The electronic system of claim 13, wherein forming the plurality of rows of hardmask material comprises forming a plurality of rows of insulating material and depositing a layer of hardmask material on top of the plurality of rows of insulating material.

15. The electronic system of claim 13, wherein a first subset of the plurality of rows are formed by a lithographic step and wherein a second subset of the plurality of rows are thereafter formed by a deposition step.

16. The electronic system of claim 15, wherein a first subset of the plurality of rows are formed by a lithographic step and wherein a second subset of the plurality of rows are thereafter formed by a deposition step.

17. The electronic system of claim 16, wherein the deposition step comprises forming sidewall hardmask features on the sides the first subset of the plurality of rows and depositing the second subset of the plurality of rows, wherein a thickness of sidewall material in the sidewall hardmask features is defined by the deposition step.

18. The electronic system of claim 15, wherein a first subset of the plurality of columns are formed by a lithographic step and wherein a second subset of the plurality of columns are thereafter formed by a deposition step.

19. The electronic system of claim 18, wherein the deposition step comprises forming sidewall hardmask features on the sides the first subset of the plurality of columns and depositing the second subset of the plurality of columns, wherein a thickness of sidewall material in the sidewall hardmask features is defined by the deposition step.

20. The electronic circuit of claim 13, wherein the holes in which memory cells are formed have corners and these corners are rounded.

* * * * *

UNITED STATES PATENT AND TRADEMARK OFFICE
CERTIFICATE OF CORRECTION

PATENT NO.      : 9,437,657 B2
APPLICATION NO. : 14/616128
DATED           : September 6, 2016
INVENTOR(S)     : Daniel Robert Shepard Page 1 of 1

It is certified that error appears in the above-identified patent and that said Letters Patent is hereby corrected as shown below:

In the Specification

Column 4, Line 44, please delete "anisotropicly" and insert --anisotropically--

In the Claims

Column 13, Line 20, please delete "rows:" and insert --rows;--

Signed and Sealed this
Third Day of January, 2017

Michelle K. Lee
*Director of the United States Patent and Trademark Office*